United States Patent
Liaw

(10) Patent No.: US 9,558,809 B1
(45) Date of Patent: Jan. 31, 2017

(54) LAYOUT OF STATIC RANDOM ACCESS MEMORY ARRAY

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/974,913

(22) Filed: Dec. 18, 2015

(51) Int. Cl.
| | |
|---|---|
| *G11C 11/00* | (2006.01) |
| *G11C 11/417* | (2006.01) |
| *H01L 27/11* | (2006.01) |
| *G11C 11/412* | (2006.01) |

(52) U.S. Cl.
CPC ........... *G11C 11/417* (2013.01); *G11C 11/412* (2013.01); *G11C 11/4125* (2013.01); *H01L 27/11* (2013.01)

(58) Field of Classification Search
CPC .. G11C 11/412; G11C 11/419; G11C 11/4125; G11C 7/1006; H01L 27/11
USPC .............. 365/51, 63, 72, 104, 154, 156, 226
See application file for complete search history.

(56) References Cited

U.S. PATENT DOCUMENTS

| | | | | |
|---|---|---|---|---|
| 6,178,134 B1 * | 1/2001 | Evans | ................... | G11C 11/419 257/E27.099 |
| 6,404,670 B2 * | 6/2002 | Shau | ................... | G11C 7/1006 257/E27.092 |
| 6,741,492 B2 * | 5/2004 | Nii | ....................... | G11C 11/4125 257/E27.099 |
| 7,990,760 B2 * | 8/2011 | Fukano | ................. | G11C 11/412 365/156 |

* cited by examiner

*Primary Examiner* — Tha-O H Bui
(74) *Attorney, Agent, or Firm* — McDermott Will & Emery LLP

(57) ABSTRACT

A column of a static random access memory (SRAM) array includes a first subarray including a first plurality of SRAM cells and a second subarray including a second plurality of SRAM cells. Each of the first and second plurality of SRAM cells includes first through fourth source active regions by which source regions of transistors thereof are formed. The column of the SRAM array includes a first bitline formed by the third source active regions of the first plurality of SRAM cells, a second bitline formed by the third source active regions of the second plurality of SRAM cells and spaced apart from the first bitline, and a third bitline formed by a metal layer extending over the third source active regions of the first and second plurality of SRAM cells and electrically connected to the second bitline but not to the first bitline.

20 Claims, 24 Drawing Sheets

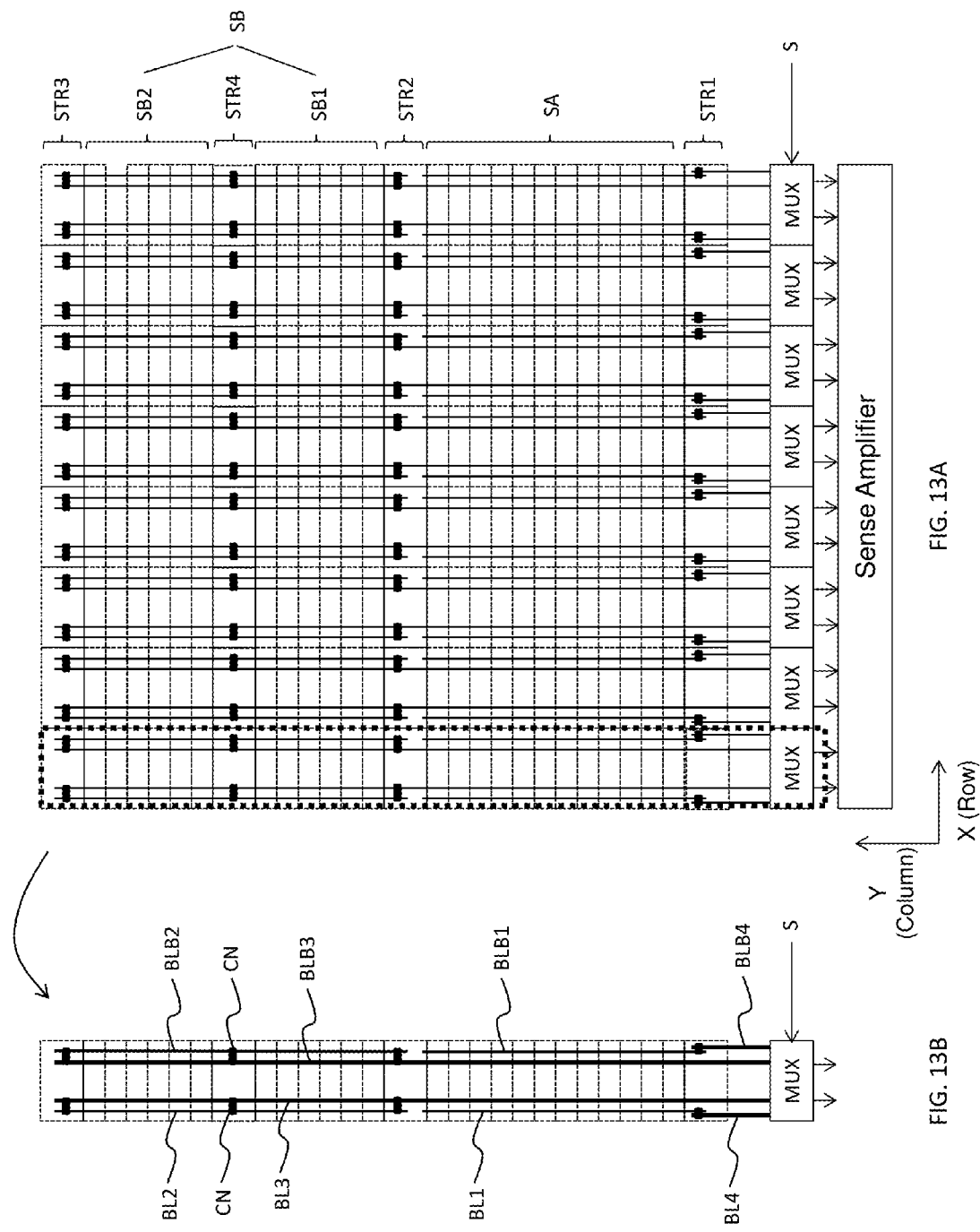

LAYOUT OF STATIC RANDOM ACCESS MEMORY ARRAY

TECHNICAL FIELD

The present disclosure relates to a layout of a static random access memory (SRAM) array, and more particularly to, a layout of an SRAM array having improved bitline architecture.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

Another candidate is a gate-all-around (GAA) device. While a Fin FET device has a fin bottom portion which is not controlled by a gate, in a GAA device, all of the surfaces of the channel layer can be subject to gate control. A GAA device, such as a GAA MOSFET (or MISFET) device, includes a very narrow cylindrical channel body. In particular, a vertical GAA device (VGAA) having a channel extending in a vertical direction (i.e., perpendicular to the substrate) is a promising device as a candidate for low power SRAM applications. In the present disclosure, new layout structures and configurations of an SRAM using a VGAA device with a small unit cell area are provided.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 13A through 16B are exemplary layout structures of bitlines of an SRAM array according to various embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Throughout the entire disclosure, specifying source active region or source region, and drain region is merely to distinguish two heavily doped regions disposed at opposite ends of a channel of a respective transistor. It should be appreciated that source active region or source region, and drain active region or drain region can be interchangeably used, respectively, without altering working principles of the present disclosure.

Figure 1B:
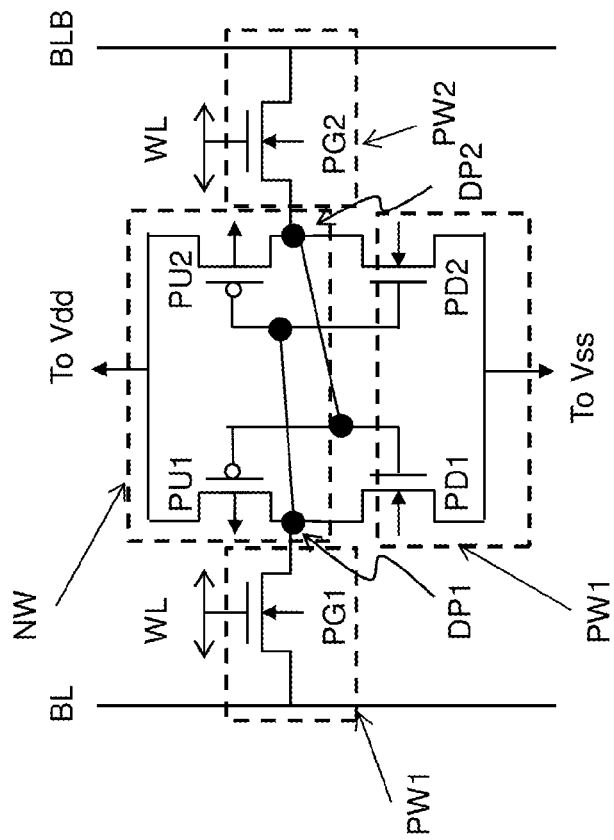
FIGS. 1A and 1B are exemplary circuit diagrams of an SRAM cell according to an embodiment of the present disclosure.
Figure 1A:
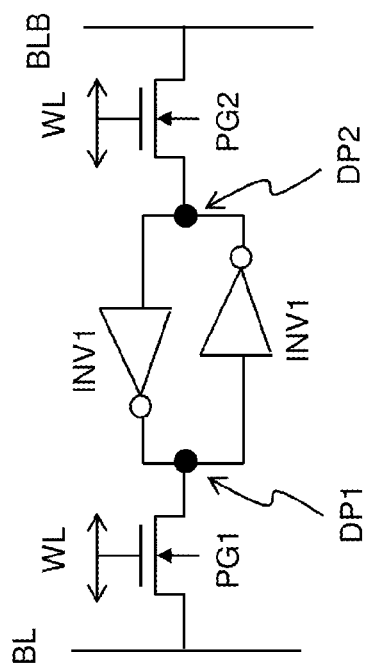

FIGS. 1A and 1B are exemplary circuit diagrams of an SRAM cell according to an embodiment of the present disclosure.

Referring to FIG. 1A, an SRAM cell includes two cross-coupled inverters INV1 and INV2. The output of the first inverter INV1 is coupled to the input of the second inverter INV2, and the output of the second inverter INV2 is coupled to the input of the first inverter INV1. The SRAM further includes a first pass-gate transistor PG1 coupled to the output of the first inverter INV1 and the input of the second inverter INV2, and a second pass-gate transistor PG2 coupled to the output of the second inverter INV2 and the input of the first inverter INV1. Gate electrodes of the first and second pass-gate transistors PG1 and PG2 are coupled to a wordline WL, a source region of the first pass-gate transistor PG1 is coupled to a bitline BL, and a source region of the second pass-gate transistor PG1 is coupled to a complementary bitline BLB, which is the complement of the bitline BL.

Referring to FIG. 1B, the first inverter INV1 includes a first pull-up transistor PU1 and a first pull-down transistor PD1. The second inverter INV2 includes a second pull-up transistor PU2 and a second pull-down transistor PD2. The first and second pull-down transistors PD1 and PD2 and the first pass-gate transistor PG1 are disposed within a first P-type well PW1, the second pass-gate transistor PG2 is disposed within a second P-type well PW2, and the first and second pull-up transistors PU1 and PU2 are disposed within an N-type well NW. A pull-up transistor is a P-type transistor of which source/drain is connected to a first voltage potential and a pull-down transistor is an N-type transistor of which source/drain is connected to a second power voltage potential lower than the first voltage potential. For example, source regions of the first and second pull-up transistors PU1 and PU2 are connected to a voltage potential Vdd provided by a power supply circuit (not shown) and source regions of the first and second pull-down transistors PD1 and PD2 are connected to another voltage potential Vss lower than Vdd provided by the power supply circuit. Drain regions of the first pull-up transistor PU1, the first pull-down transistor PD1, and the first pass-gate transistor PG1, and gate electrodes of the second pull-up transistor PU2 and the second pull-down transistor PD2, are connected by a data storage node DP1. Drain regions of the second pull-up transistor PU2, the second pull-down transistor PD2, and the second pass-gate transistor PG2, and gate electrodes of the first pull-up transistor PU1 and the first pull-down transistor PD1, are connected by a complementary data storage node DP2. Such features will be more apparent with reference to FIG. 10B which will be described later.

Although as shown in FIGS. 1A and 1B, the first and second pass-gate transistors PG1 and PG2 are N-type transistors, the present disclosure is not limited thereto. According to another embodiment, the first and second pass-gate transistors PG1 and PG2 may be P-type transistors.

Figure 2:
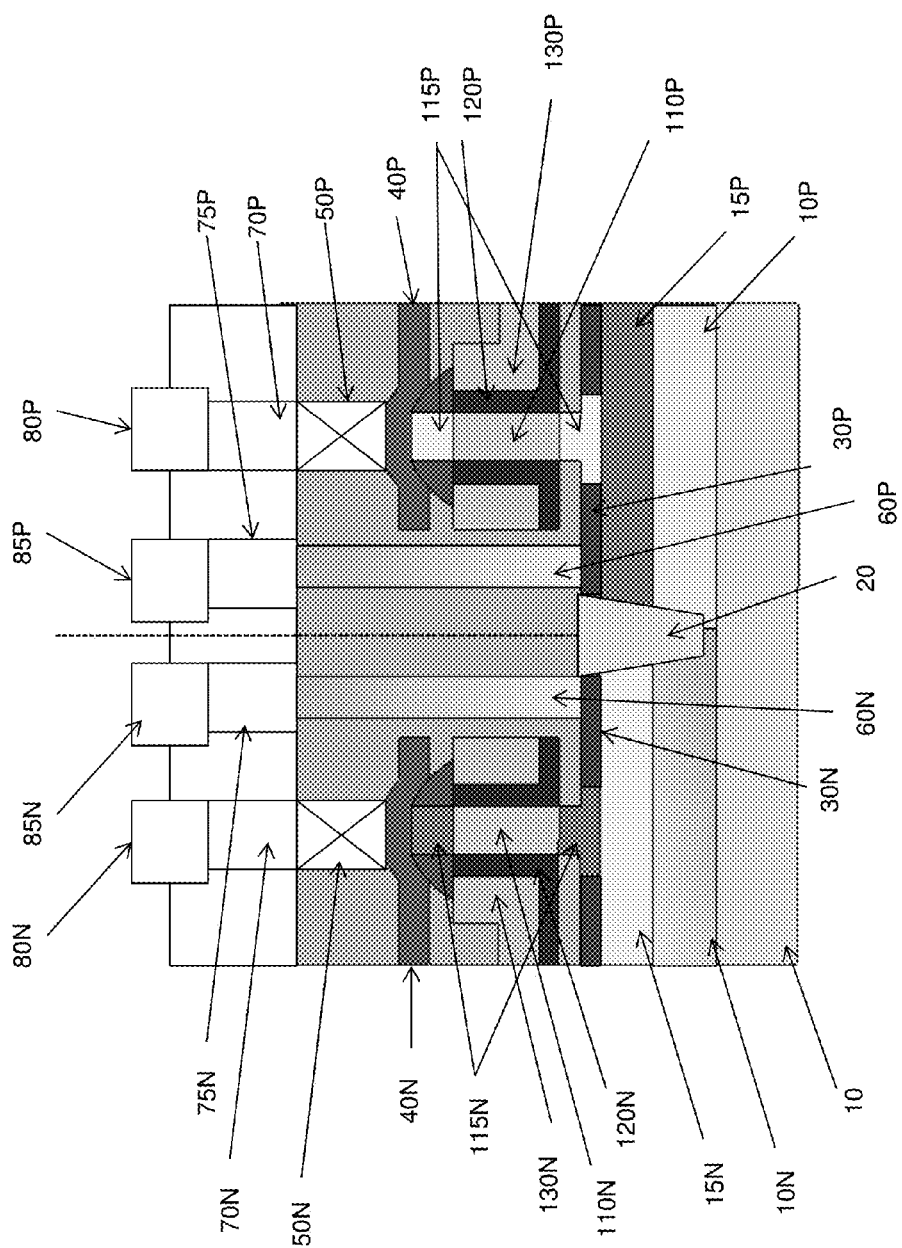
FIG. 2 is an exemplary cross-sectional view of vertical gate-all-around (VGAA) transistors according to an embodiment of the present disclosure.

FIG. 2 is an exemplary cross-sectional view of VGAA transistors according to an embodiment of the present disclosure. The transistors illustrated in FIG. 2 may be employed to implement the SRAM cell illustrated in FIGS. 1A and 1B.

Referring to FIG. 2, an N-type transistor and a P-type transistor are formed on a substrate 10, for example, a silicon substrate. A P-type well 10N and an N-type well 10P are formed in the substrate 10. An N-type source active region 15N and a P-type source active region 15P are formed in the P-type well 10N and the N-type well 10P, respectively. A source active region, of which a source region of a transistor is formed, refers to a diffusion region heavily doped with impurities formed in a top portion of a well in a substrate, and is surrounded by an insulating layer such as a shallow trench isolation (STI). The STI has a trench depth deeper than the source active region but shallower than the well in which the source active region is formed. Adjacent source active regions are separated by the STI interposed therebetween. For example, as shown in FIG. 2, an N-type device region including the P-type well 10N and the N-type source active region 15N is separated by an STI 20 from a P-type device region including the N-type well 10P and the P-type source active region 15P. In some embodiments, silicide layers 30N and 30P are formed on and conterminous to the source active regions 15N and 15P, respectively, except that portions of the silicide layer 30N and 30P are removed so as to form the N-type and P-type transistors. A combination of the N-type source active regions 15N and the silicide layer 30N formed thereon, and a combination of the P-type source active regions 15P and the silicide layers 30P formed thereon, are referred to bottom plates of the N-type and P-type transistors. According to some embodiments, a germanide layer, instead of silicide layer, may be alternatively formed on a source active region to implement a bottom plate including the source active region and the germanide layer. Although not shown in FIG. 2, two or more transistors having the same type can be formed in the same source active region. Such features will be more apparent with reference to FIG. 7A to be described later.

The N-type source active region 15N for the N-type transistor may include an epitaxially-growth material. The epitaxially-growth material may be one or more layers of SiP, SiC, SiPC, Si, Ge, or a III-V material, or any other suitable materials. The P-type active region 15P for the P-type transistor may include an epitaxially-growth material. The epitaxially-growth material may be one or more layers of Si, SiGe, Ge, SiP, SiC or a III-V material, or any other suitable materials.

As illustrated in FIG. 2, channel layers 110N and 110P extend in the vertical direction (the normal direction of the substrate 10) and the carriers (electrons or holes) travels in the channel layers 100N and 110P along the vertical direction. The shape of the channel layer may be a wire in nano-meter scale having a substantially uniform diameter. The diameter of the nano-wire is in a range of from 5 nm to about 50 nm in some embodiments, or is in a range from about 10 nm to about 30 nm in other embodiments. The number of nano-wires in one transistor is one or more. According to other embodiments, although not shown in FIG. 2, the shape of the channel layer may be a bar-shape in nano-meter scale having a substantially rectangular shape including a pair of longer sides and a pair of shorter sides in a plane parallel to a major surface of the substrate 10. The longer side of the nano-bar is in a range from about 10 nm to about 60 nm in some embodiments, or is in a range from about 20 nm to about 40 nm in other embodiments, and the shorter side is in a range from about 5 nm to about 50 nm in some embodiments, or is in a range from about 10 nm to about 30 nm in other embodiments. When transistors having nano-bar channels are employed in the SRAM cell illustrated in FIG. 1B, the shorter-side width of the nano-bar of the first and second pull-down transistors PD1 and PD2 is wider than that of the first and second pull-up transistors PU1 and PU2 by, for example, about 20%, and/or the shorter-side width of the nano-bar of the first and second pass-gate transistors PG1 and PG2 is wider than that of the first and second pull-up transistors PU1 and PU2 by, for example, about 20%.

The material for forming the nano-wire and the nano-bar is Si, Ge, SiGe, SiC, SiP, SiPC, or SiGeB, or a III-V material, or any other suitable materials, with appropriate dopants. The III-V material may be one or more of InP, InAs, GaAs, AlInAs, InGaP, InGaAs, GaAsSb, GaPN and AlPN, or any other suitable materials.

Referring to FIG. 2, the N-type transistor further includes source/drain LDD (lightly doped drain) regions 115N, and a drain region (top plate) 40N. The channel layer 110N is surrounded by a gate dielectric layer 120N, which is further surrounded by a gate electrode layer 130N.

Similarly, the P-type transistor further includes source/drain LDD regions 115P, and a drain region (top plate) 40P. The channel layer 110P is surrounded by a gate dielectric layer 120P, which is further surrounded by a gate electrode layer 130P.

The source region or source active region and drain region of the N-type transistor may include one or more dopants such as P, As, Sb, N or C, or any other suitable elements. The source region or source active region and drain region of the P-type transistor may include one or more dopants such as B, In, N or C, or any other suitable elements.

According to some embodiments, although not shown in FIG. 2, the N-type and P-type transistor may further include one or more layers of Si, Ti-based silicide, Co-based silicide, Ni-based silicide, Pt-based silicide, TiN, TaN, W, Cu, Al, or combination thereof, or any other suitable materials formed on the drain regions 40N and 40P, together with the drain regions 40N and 40P to form top plates.

The drain region 40N is connected to a first metal wiring 80N through a plate contact 50N and a first via 70N. A contact bar 60N is provided to connect the N-type source active region 15N through the silicide layer 30N and a second via 75N that is further connected to a second metal wiring 85N. The drain region 40P is connected to a first metal wiring 80P through a plate contact 50P and a first via 70P. A contact bar 60P is provided to connect the P-type source active region 15P through the silicide layer 30P and a second via 75P that is further connected to a second metal wiring 85P. The plate contacts 50N and 50P are made of one or more layer of Cu, W, Al, AlCu, TiN, TiW, Ti, Co, Ni, TaN, Ta, or any other suitable metals, or combination thereof. The vias 70N, 70P, 75N, and 75P and the metal wirings 80N, 80P, 85N, and 85P are made of one or more layers of Cu, W, Al, AlCu, TiN, TiW, Ti, Co, Ni, TaN, Ta, or any other suitable metals, or combination thereof.

The material for the gate electrode layer may be poly-Si, poly-Si with silicide, Al, Cu, W, Ti, Ta, TiN, TaN, TiW, WN, TiAl, TiAlN, TaC, TaCN and TiSiN, or any other suitable materials.

In certain embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, one or more work function adjustment layers (not shown) may be interposed between the gate dielectric layer and the gate electrode layer. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials.

As described above, the channel layers 110N and 110P of the N-type and P-type transistors illustrated in FIG. 2 are vertically formed on the substrate 10 and are surrounded by the gate electrode layers 130N and 130P. Accordingly, such transistors, which may be employed to implement the SRAM cell of FIG. 1B, are vertical gate-all-around (VGAA) transistors.

Figure 3:
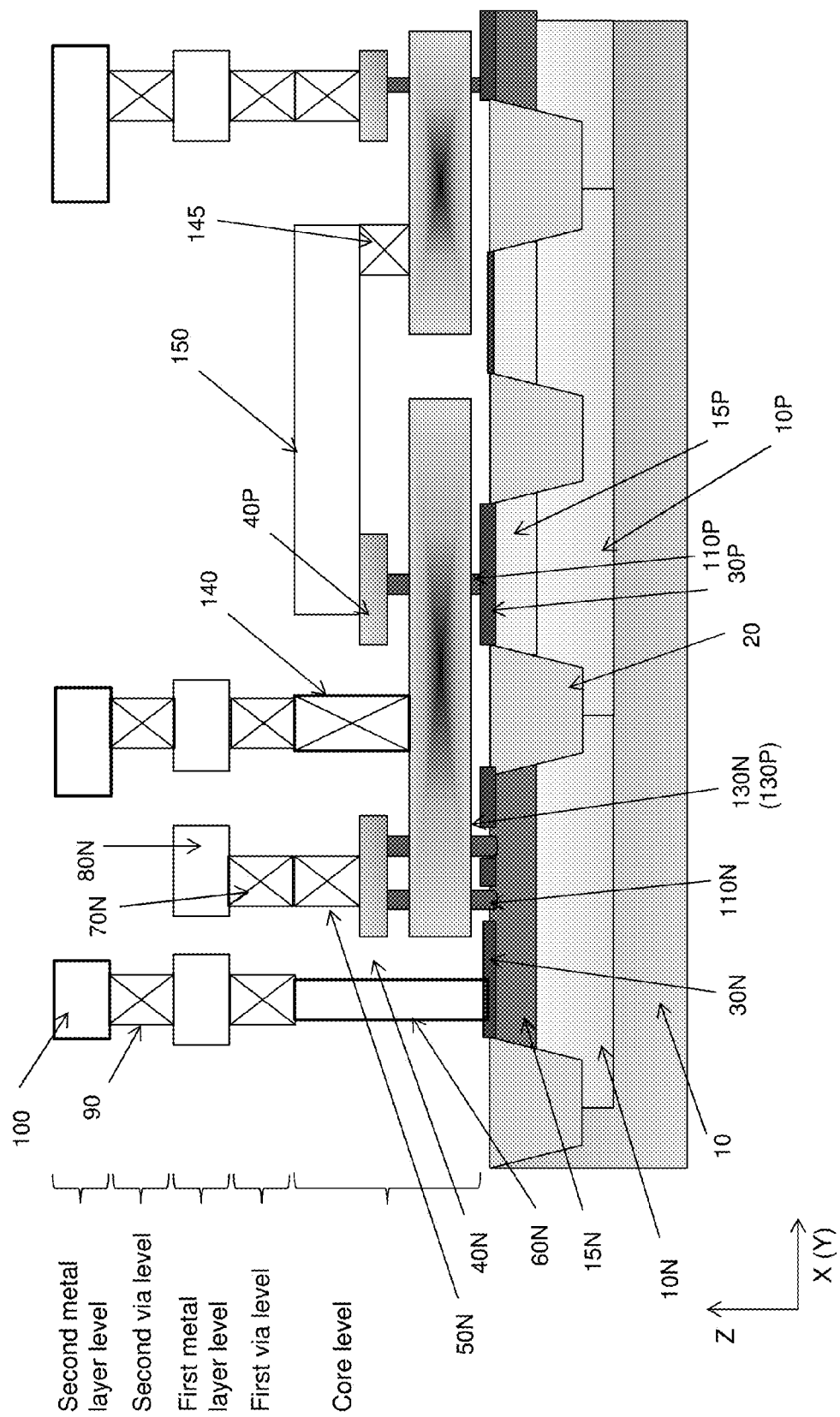
FIG. 3 is an exemplary cross-sectional view schematically illustrating a vertical layer arrangement of VGAA transistors according to one embodiment of the present disclosure.
Figure 4:
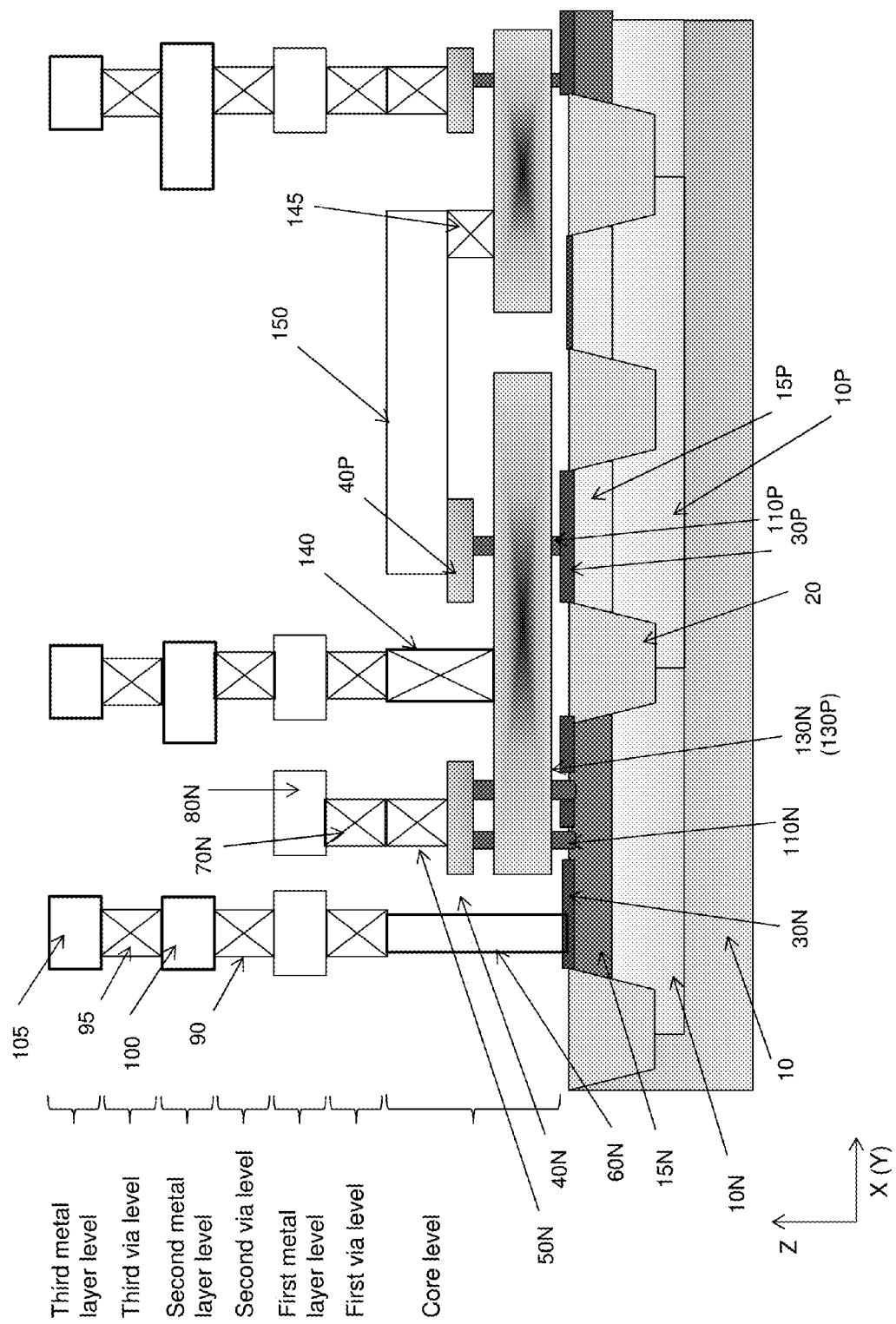
FIG. 4 is an exemplary cross-sectional view schematically illustrating another vertical layer arrangement of VGAA transistors according to another embodiment of the present disclosure.

FIG. 3 is an exemplary cross-sectional view schematically illustrating a vertical layer arrangement of VGAA transistors according to one embodiment, in which only two metal layers are required. FIG. 4 is an exemplary cross-sectional view schematically illustrating another vertical layer arrangement of VGAA transistors according to another embodiment, in which three metal layers are implemented. In the following description, components the same as those described in the embodiment with reference to FIG. 2 will be denoted by the same reference numerals, and a redundant description will be omitted.

Referring to FIGS. 3 and 4, in the substrate level, the substrate 10, and the wells 10N and 10P are disposed. In the core level, the source active regions 15N and 15P, the silicide layers 30N and 30P, the channel layers 110N and 110P, the gate electrode layers 130N (130P), the drain regions (top plates) 40N and 40P, the plate contacts 50N, and the contact bars 60N are disposed. The core level also includes a gate contact 140. Further, a local connection structure including a gate contact 145 and a local connection layer 150 is disposed in the core level. In the first via level, the first vias 70N are disposed. In the first metal layer level, the first metal wirings 80N are disposed. In the second via level, the second vias 90 are disposed. In the second metal layer level, the second metal wirings 100 are disposed.

To implement a third metal layer level in the vertical layer arrangement of VGAA transistors, as shown in FIG. 4, in the third via level, third vias 95 are disposed. In the third metal layer level, third metal wirings 105 are disposed.

The aforementioned VGAA transistors and vertical layer arrangement thereof may be modified to implement the SRAM cell of which the circuit diagrams are illustrated in FIGS. 1A and 1B. Other features thereof will be more apparent as described as follows.

Figure 5:
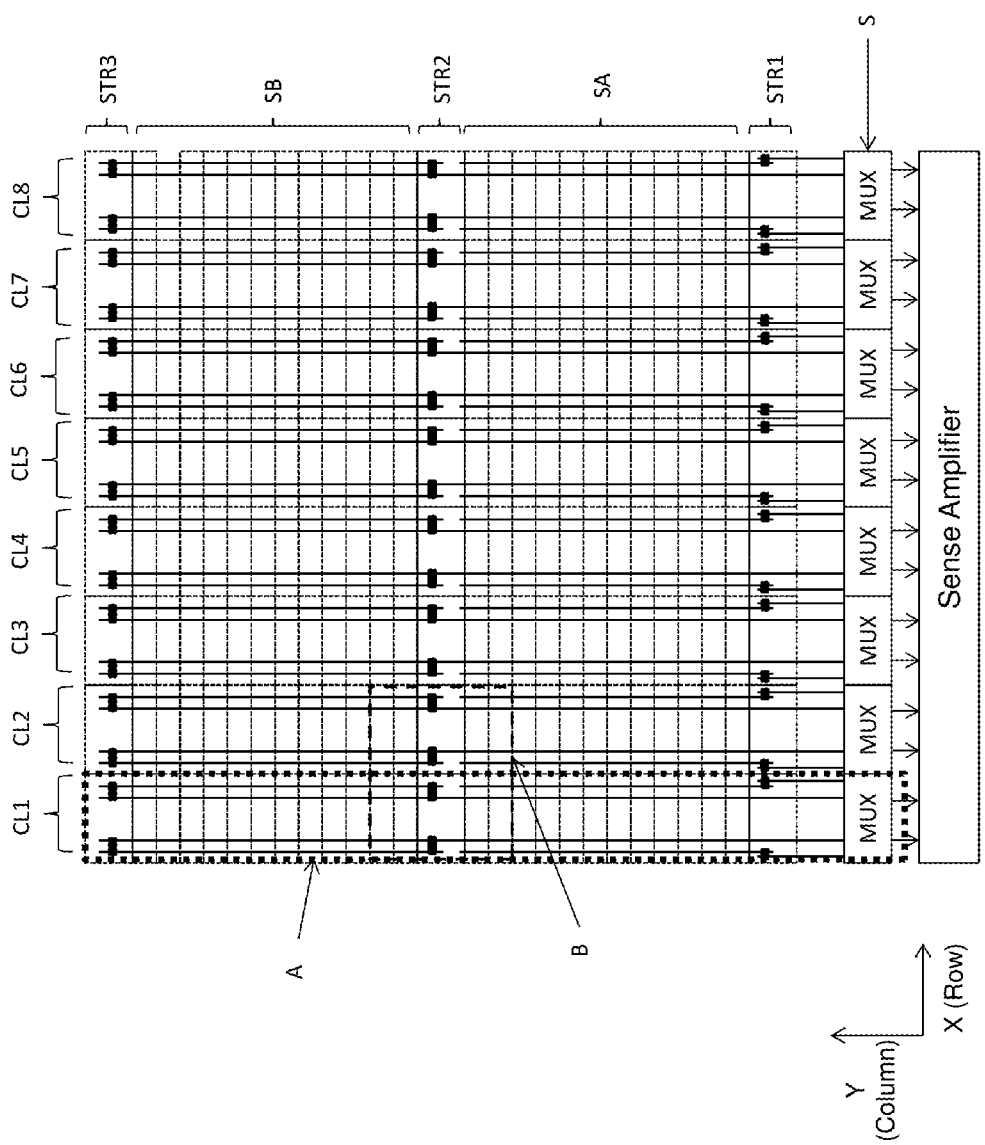
FIG. 5 is an exemplary layout structure of bitlines of an SRAM array according to one embodiment of the present disclosure.
Figure 6:
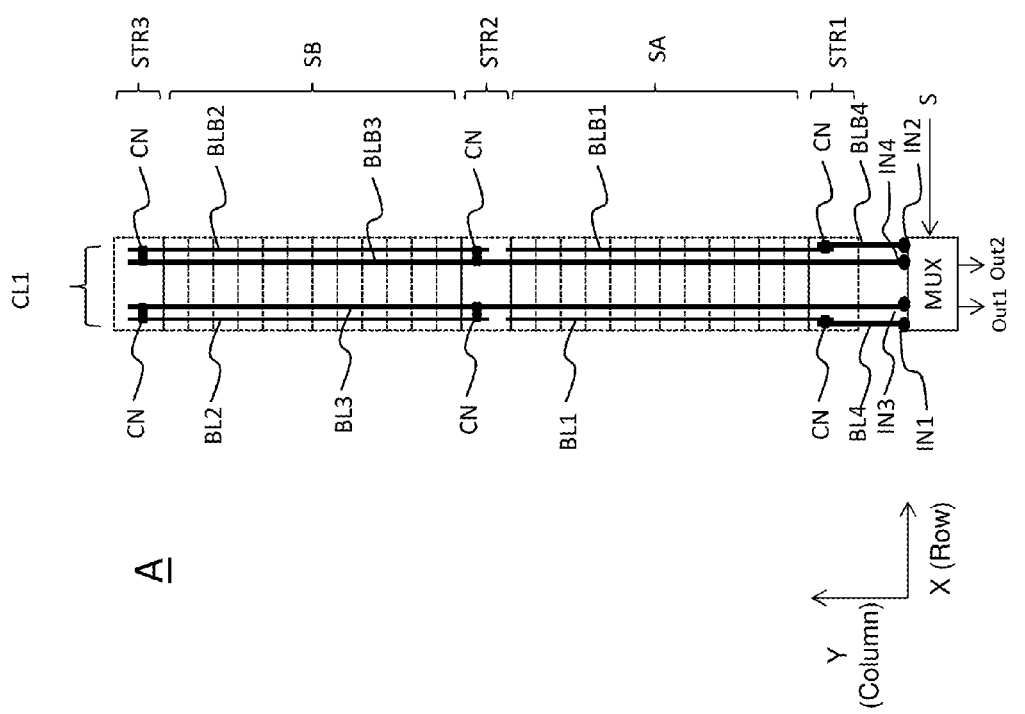
FIG. 6 shows an enlarged view of portion A illustrated in FIG. 5.

FIG. 5 is an exemplary layout structure of bitlines of an SRAM array according to one embodiment of the present disclosure, in which the aforementioned VGAA transistors and vertical layer arrangements of the VGAA transistors may be employed. FIG. 6 shows an enlarged view of portion A illustrated in FIG. 5.

As shown in FIG. 5, the SRAM array includes a first subarray SA and a second subarray SB arranged in Y (column) direction. Each of the first and second subarrays SA and SB includes a plurality of SRAM cells arranged in X (row) direction and Y (column) direction. The SRAM array further includes a first strap region STR1, a second strap region STR2, and a third strap region STR3. The first subarray SA is arranged between the first strap region STR1 and the second strap region STR2. The second subarray SB is arranged between the second strap region STR2 and the third strap region STR3 in Y (column) direction. In other words, the first strap region STR1, the first subarray SA, the second strap region STR2, the second subarray SB, and the third strap region STR3 are sequentially arranged in Y (column) direction. The number of subarrays is not limited to two. The SRAM array may be divided into three, four or more subarrays. In the present disclosure, a strap region is a region between subarrays or located at an end of a subarray, in which some of conductive lines (e.g., source active regions and silicide layers (bottom plates), and metal layers) formed in different levels are vertically connected. Such features will be more apparent with reference to FIGS. 7A and 8 to be described later.

In each subarray, the number of SRAM cells is 4 to 256. The present disclosure, however, is not limited thereto. First through eighth columns CL1 through CL 8 arranged in X (row) direction are illustrated in FIG. 5 as an example, but the present disclosure is not limited thereto.

Each column of the SRAM array includes a plurality of SRAM cells. A layout of an SRAM cell according to one embodiment will be explained with reference to FIGS. 10A through 10D later. A circuit diagram of the SRAM cell may be the same as those illustrated in FIGS. 1A and 1B.

Now referring to FIG. 6, the first column CL1 of the SRAM array includes a first bitline BL1 and a first complementary bitline BLB1 formed over the first subarray SA, a second bitline BL2 and a second complementary bitline BLB2 formed over the second subarray SB. The first bitline BL1 and the first complementary bitline BLB1 are formed by source active regions or bottom plates of first and second pass-gate transistors of all the SRAM cells of the first subarray SA in the first column CL1. Thus, the first bitline BL1 and the first complementary bitline BLB1 are electrically connected to source regions of the first and second pass-gate transistors of all the SRAM cells of the first subarray SA in the first column CL1, respectively. The second bitline BL2 and the second complementary bitline BLB2 are formed by source active regions or bottom plates of first and second pass-gate transistors of all the SRAM cells of the second subarray SB in the first column CL1 along which the second bitline BL2 and the second complementary bitline BLB2 extend. Thus, the second bitline BL2 and the second complementary bitline BLB2 are electrically connected to source regions of the first and second pass-gate transistors of all the SRAM cells of the second subarray SB in the first column CL1, respectively. Each of the first and second bitlines BL1 and BL2 and the first and second complementary bitlines BLB1 and BLB2 is formed of one continuous source active region. The relation of the first and second bitlines BL1 and BL2 and the first and second complementary bitlines BLB1 and BLB2, and the source active regions of the first and second pass-gate transistors of the SRAM cells, will be more apparent with reference to FIG. 7A and FIGS. 8 through 10D.

Referring to FIG. 6, the first column CL1 further includes a third bitline BL3 and a third complementary bitline BLB3. In the present embodiment, the third bitline BL3 and the third complementary bitline BLB3 are formed in the same metal layer. The second bitline BL2 and the second complementary bitline BLB2 are respectively electrically connected to the third bitline BL3 and the third complementary bitline BLB3 through connection members CN formed at ends of the second subarray SB. The first bitline BL1 and the third bitline BL3 are electrically isolated from each other, and the first bitline complementary BLB1 and the third complementary bitline BLB3 are electrically isolated from each other. These features will be more apparent with reference to FIG. 7A and FIGS. 8 through 10D.

Still referring to FIG. 6, the first bitline BL1 and first complementary bitline BLB1 are respectively electrically connected to a fourth bitline BL4 and a fourth complementary bitline BLB4 through connection members CN formed at an edge of the first column CL1. The fourth bitline BL4 and the fourth complementary bitline BLB4 may be formed in the same metal layer as the third bitline BL3 and the third complementary bitline BLB3.

First through fourth input terminals IN1 through IN4 of a multiplexor MUX of the first column CL1 are electrically connected to the first bitline BL1 via the fourth bitline BL4, the first complementary bitline BLB1 via the fourth complementary bitline BLB4, the second bitline BL2 via the third bitline BL3, and the second complementary bitline BLB2 via the third complementary bitline BLB3, respectively. Thus, data transmitted from one of the first bitline BL1 and the first complementary bitline BLB1 and one of the second bitline BL2 and the second complementary bitline BLB2 is selectively output at output terminals Out1 and Out2 of the multiplexor MUX, in accordance with a selection signal S applied thereto. The output data corresponding to data stored by a respective SRAM cell may be sensed and amplified by a sense amplifier of the SRAM array.

Although not shown in FIG. 6, power supply lines and connections thereof can be formed in a similar manner as the bitlines and bitline connections thereof as shown in FIG. 6. Such features are more apparent with reference to FIG. 17 to be described later.

Figure 7A:
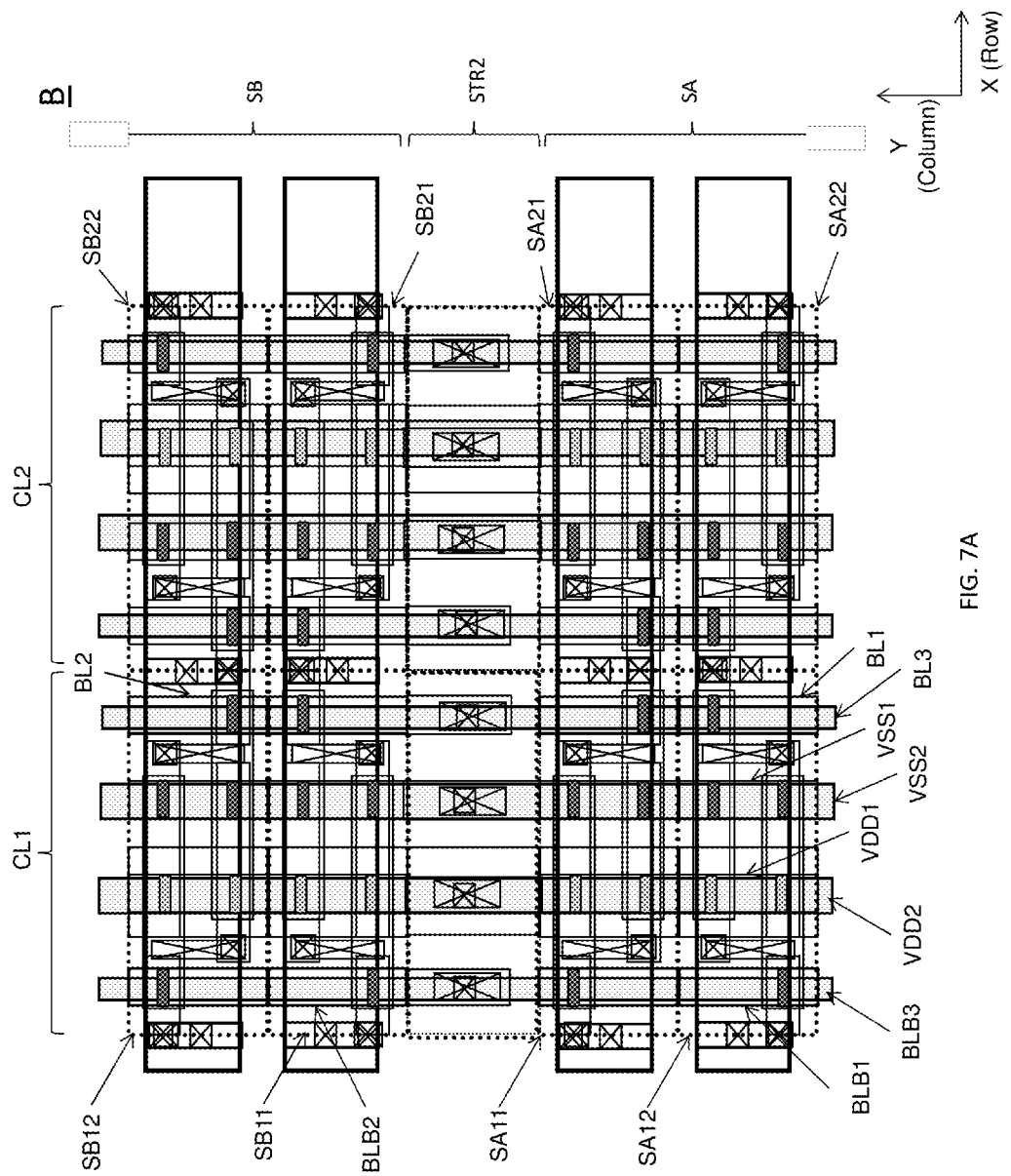
FIG. 7A is a layout of portion B illustrated in FIG. 5.
Figure 7B:
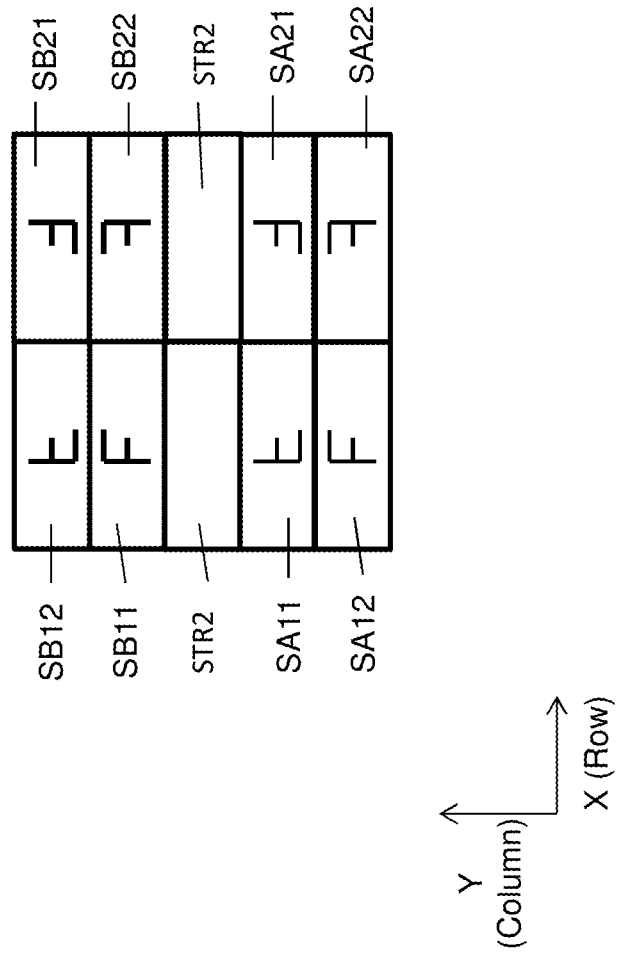
FIG. 7B is a schematic view of the layout illustrated in FIG. 7A.
Figure 8:
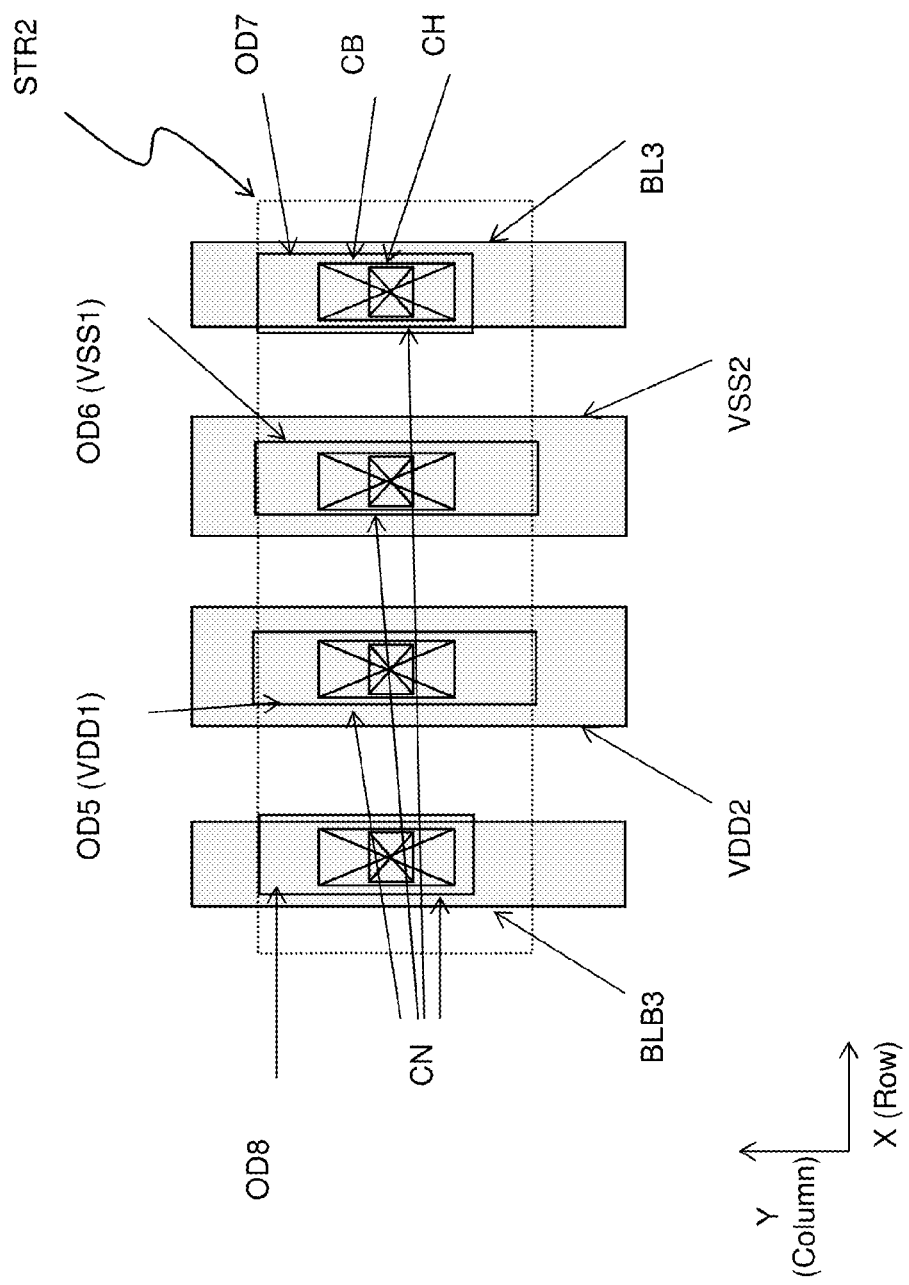
FIG. 8 is a layout of a unit cell of a second strap region illustrated in FIG. 7A.
Figure 9:
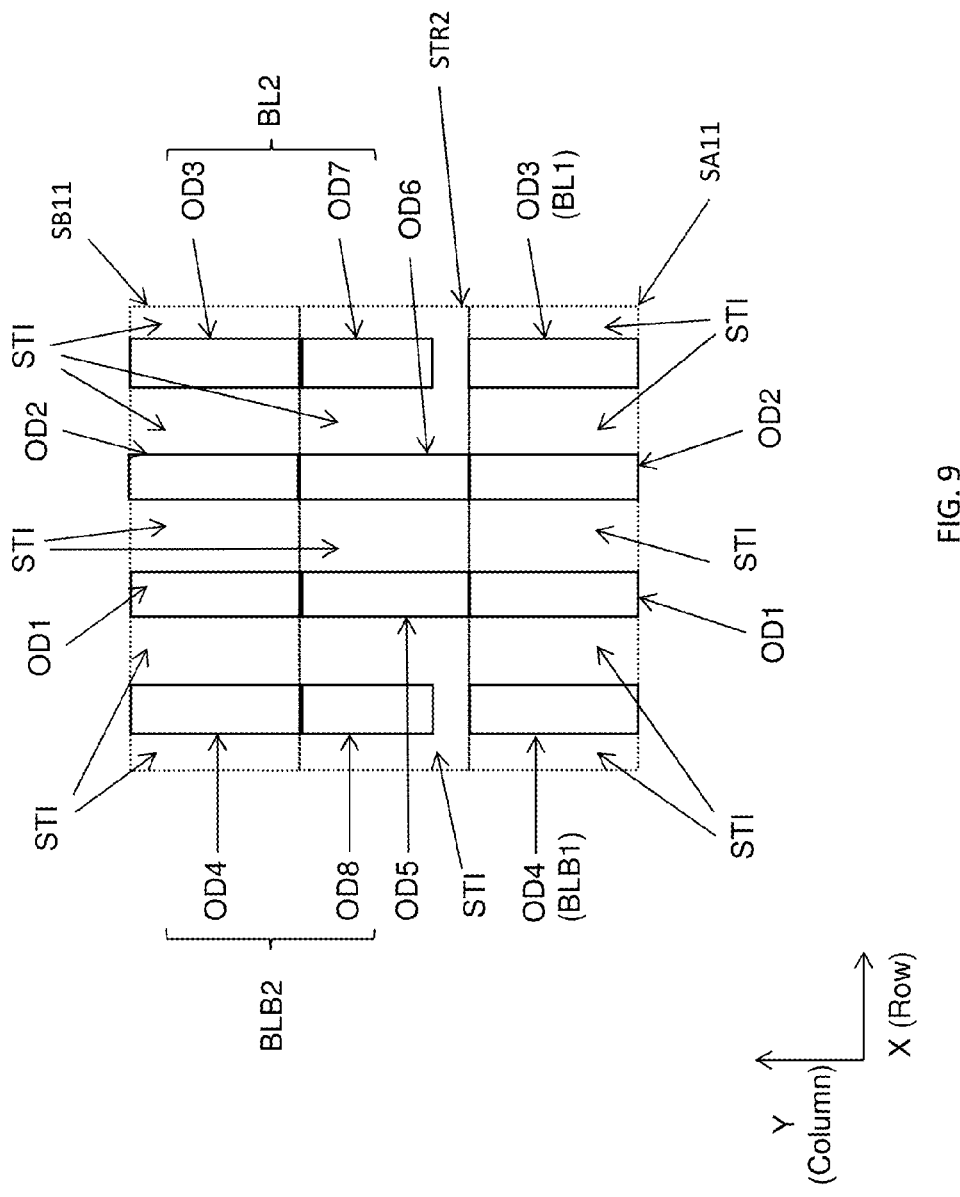
FIG. 9 is a layout of source active regions of a unit cell of a second strap region and two SRAM cells between which the unit cell of the second strap region of FIG. 7A is interposed.

FIG. 7A is a layout of portion B illustrated in FIG. 5 and FIG. 7B is a schematic view of the layout illustrated in FIG. 7A. FIG. 8 is a layout of a unit cell of a second strap region STR2 illustrated in FIG. 7A. FIG. 9 is a layout of source active regions of the unit cell of the second strap region and two SRAM cells between which the unit cell of the second strap region is interposed. FIGS. 10A through 10D are layouts of an SRAM cell, according to an embodiment of the present disclosure, which is employed by the SRAM array illustrated in FIG. 5.

Referring to FIGS. 5, 7A, and 7B, region B includes eight SRAM cells including SRAM cells SA11, SA21, SA12, and SA22 of the first subarray SA and SRAM cells SB11, SB21, SB12, and SB22 of the second subarray SB and two strap unit cells of the second strap region STR2.

As shown in FIGS. 7A and 7B, the first column CL1 includes the SRAM cells SA12, SA11, SB11, and SB12 sequentially arranged in Y (column) direction and one unit cell of the second strap region STR2 interposed between the SRAM cells SA11 and SB11. The second column CL2 includes SA22, SA21, SB21 and SB22 sequentially arranged in Y (column) direction and another unit cell of the second strap region STR2 interposed between the SRAM cells SA21 and SB21. Any SRAM cells of the first column CL1 and any SRAM cells of the second column CL2 are arranged symmetric with reference to a boundary of the first and second columns CL1 and CL2. Any SRAM cells of two rows that are immediately adjacent to each other are disposed symmetrically with reference to a boundary thereof. It should be appreciated that all the SRAM cells may have the same layout, although the orientation of each cell may be different from those immediately adjacent thereto.

As set forth above, the source active regions are made of a semiconductor material, such as Si-base material or a Ge-base material, with heavily doped impurities to form source regions of transistors. Although not included in the layouts illustrated in FIGS. 7A and 9 through 10D, similar to the silicide layers 30N and 30P formed over the source active regions 15N and 15P described above with reference to FIGS. 2 through 4, a silicide layers or a germanide layer may be formed over each source active region to form a bottom plate to improve electrical conductivity thereof. The silicide layer or germanide layer may include one or more of Ti, Co, Ni, Mo or Pt or any other suitable elements. Thus, the bottom plates, which include the source active layers and the silicide layers or germanide layers formed thereon, have greater electrical conductivity than the source active regions. It should be appreciated that a silicide layer or germanide layer is conterminous to a respective source active region on which the silicide layer or germanide layer is formed except that a portion or portions of the silicide layer or germanide layer are removed so as to form one or more transistors. In this case, whenever source active regions of adjacent SRAM cells are continuously formed, the corresponding silicide layers or germanide layers are continuously formed.

Referring to FIGS. 7A, 7B, and 9, first through fourth source active regions OD1 through OD4 of one SRAM cell, and first through fourth source active regions OD1 through OD4 of another SRAM cell of the same column in the same subarray as the one SRAM cell, are respectively formed of the same continuous source active regions.

Now referring to FIGS. 6, 7A, and 8 through 10D, in the same first column CL1, first source active regions OD1 (see FIGS. 9 and 10A) of the SRAM cells SA11 and SA12 (see FIG. 7A) of the first subarray SA, by which all source regions of the first and second pull-up transistors PU1 and PU2 (see FIGS. 10A and 10B) of the SRAM cells SA11 and SA12 (see FIG. 7A) are formed, first source active regions OD1 (see FIGS. 9 and 10A) of the SRAM cells SB11 and SB12 (see FIG. 7A) of the second subarray SB, by which all source regions of the first and second pull-up transistors PU1 and PU2 (see FIGS. 10A and 10B) of the SRAM cells SB11 and SB12 (see FIG. 7A) are formed, and a source active region OD5 (see FIGS. 8 and 9) of the unit cell of the second strap region STR2, form a single continuous source active region acting as a lower first power supply line VDD1 (see FIGS. 7A and 8). The lower first power supply line VDD1 (see FIGS. 7A and 8) is electrically connected to an upper first power supply line VDD2 (see FIGS. 7A and 8) formed of a metal layer on the SRAM array through a contact bar CB (see FIG. 8) and a first level via hole CH (see FIG. 8) formed on the contact bar CB (see FIG. 8) in the unit cell of the second strap region STR2. It should be appreciated that such a continuous source active region also extends to the other SRAM cells in the same first column CL1.

In the same first column CL1, second source active regions OD2 (see FIGS. 9 and 10A) of the SRAM cells SA11 and SA12 (see FIG. 7A) of the first subarray SA, by which all source regions of the first and second pull-down transistors PD1 and PD2 (see FIGS. 10A and 10B) of the SRAM cells SA11 and SA12 (see FIG. 7A) are formed, second source active regions OD2 (see FIGS. 9 and 10A) of the SRAM cells SB11 and SB12 (see FIG. 7A) of the second subarray SB, by which all source regions of the first and second pull-down transistors PD1 and PD2 (see FIGS. 10A and 10B) of the SRAM cells SB11 and SB12 (see FIG. 7A) are formed, and a source active region OD6 (see FIGS. 8 and 9) of the unit cell of the second strap region STR2, form a single continuous source active region acting as a lower second power supply line VSS1 (see FIGS. 7A and 8). The lower second power supply line VSS1 (see FIGS. 7A and 8) is electrically connected to an upper second power supply line VSS2 (see FIGS. 7A and 8) formed of the same metal layer as the upper first power supply line VDD2 (see FIGS. 7A and 8) through a contact bar CB (see FIG. 8) and a first level via hole CH (see FIG. 8) formed on the contact bar CB (see FIG. 8) in the unit cell of the strap region STR2. It should be appreciated that such a continuous source active region also extends to the other SRAM cells in the same first column CL1.

A configuration of the lower first power supply line VSS1 and the lower second power supply line VDD1 is more apparent with reference to FIG. 17 which will be described later.

In the same first column CL1, fourth source active regions OD4 (see FIGS. 9 and 10A) of the SRAM cells SA11 and SA12 (see FIG. 7A) of the first subarray SA, by which all source regions of the second pass-gate transistors PG2 (see FIGS. 10A and 10B) of the SRAM cells SA11 and SA12 (see FIG. 7A) are formed, are formed of a single continuous source active region acting as the first complementary bitline BLB1 (FIGS. 7A and 9), while fourth source active regions OD4 (see FIGS. 9 and 10A) of the SRAM cells SB11 and SB12 (see FIG. 7A) of the second subarray SB, by which all source regions of the second pass-gate transistors PG2 (see FIGS. 10A and 10B) of the SRAM cells SB11 and SB12 (see FIG. 7A) are formed, and a source active region OD8 (see FIGS. 8 and 9) of the unit cell of the second strap region STR2, are formed of another different single continuous source active region acting as the second complementary bitline BLB2 (see FIGS. 7A and 9). The second complementary bitline BLB2 are electrically connected to the third complementary bitline BLB3 (see FIGS. 7A and 8) extending over the first and second subarrays SA and SB through a contact bar CB (see FIG. 8) and a first level via hole CH (see FIG. 8) formed on the contact bar CB (see FIG. 8) in the unit cell of the second strap region STR2. The third complementary bitline BLB3 (see FIGS. 7A and 8) is formed in the same metal layer as the upper first power supply line VDD2 (FIGS. 7A and 8). The first complementary bitline BLB1 (see FIGS. 7A and 9) is electrically isolated from the second complementary bitline BLB2 (see FIGS. 7A and 9) and the third complementary bitline BLB3 (see FIGS. 7A and 8).

In the same first column CL1, third source active regions OD3 (see FIGS. 9 and 10A) of the SRAM cells SA11 and SA12 (see FIG. 7A) of the first subarray SA, by which all source regions of the first pass-gate transistors PG1 of the SRAM cells SA11 and SA12 (see FIG. 7A) are formed, are formed of a single continuous source active region acting as the first bitline BL1, while third source active regions OD3 (see FIGS. 9 and 10A) of the SRAM cells SB11 and SB12 (see FIG. 7A) of the second subarray SB, by which all source regions of the first pass-gate transistors PG1 (see FIGS. 10A and 10B) of the SRAM cells SB11 and SB12 (see FIG. 7A) are formed, and a source active region OD7 (see FIGS. 8 and 9) of the unit cell of the second strap region STR2, are formed of another different single continuous source active region acting as the second bitline BL2 (see FIGS. 7A and 9). The second bitline BL2 is electrically connected to the third bitline BL3 (see FIGS. 7A and 9) extending over the first and second subarrays SA and SB through a contact bar CB (see FIG. 8) and a first level via hole CH (see FIG. 8) formed on the contact bar CB (see FIG. 8) in the unit cell of the second strap region STR2. The third bitline BL3 (see FIGS. 7A and 9) is formed of the same metal layer as the upper first power supply line VDD2 (see FIGS. 7A and 8). The first bitline BL1 (see FIG. 7A) is electrically isolated from the second bitline BL2 and the third bitline BL3.

The contact bars CB formed over the source active regions OD5 through OD8 (see FIGS. 8 and 9), and the first level via holes CH (see FIG. 8) formed over the contact bars CB (see FIG. 8), and the contact bars CB (see FIG. 8) and the first level via holes CH (see FIG. 8) are formed between the source active regions OD5 through OD8 (see FIGS. 8 and 9) and the first metal layer which forms the upper first power supply line VDD2 (see FIGS. 7A and 8), the upper second power supply line VSS2 (see FIGS. 7A and 8), the third complementary bitline BLB3 (see FIGS. 7A and 8), and the third bitline BL3 (see FIGS. 7A and 8). The contact bars CB (see FIG. 8) and the first level via holes CH (see FIG. 8) may correspond to the aforementioned core level and first via level with reference to FIGS. 3 and 4.

As described above, the second strap region STR2 includes the source active regions OD5 and OD6 (see FIGS. 8 and 9), which are a part of the lower first and second power supply lines VDD1 and VSS1 (see FIGS. 7A and 8), respectively. The source active region OD5 (see FIGS. 8 and 9) is connected to the first source active regions OD1 (see FIGS. 9 and 10A) in the SRAM cells of the first column CL1 in the first and second subarrays, and the source active region OD6 (see FIGS. 8 and 9) is connected to the second source active regions OD2 (see FIGS. 9 and 10A) in the SRAM cells of the first column CL1 in the first and second subarrays.

Figure 10A:
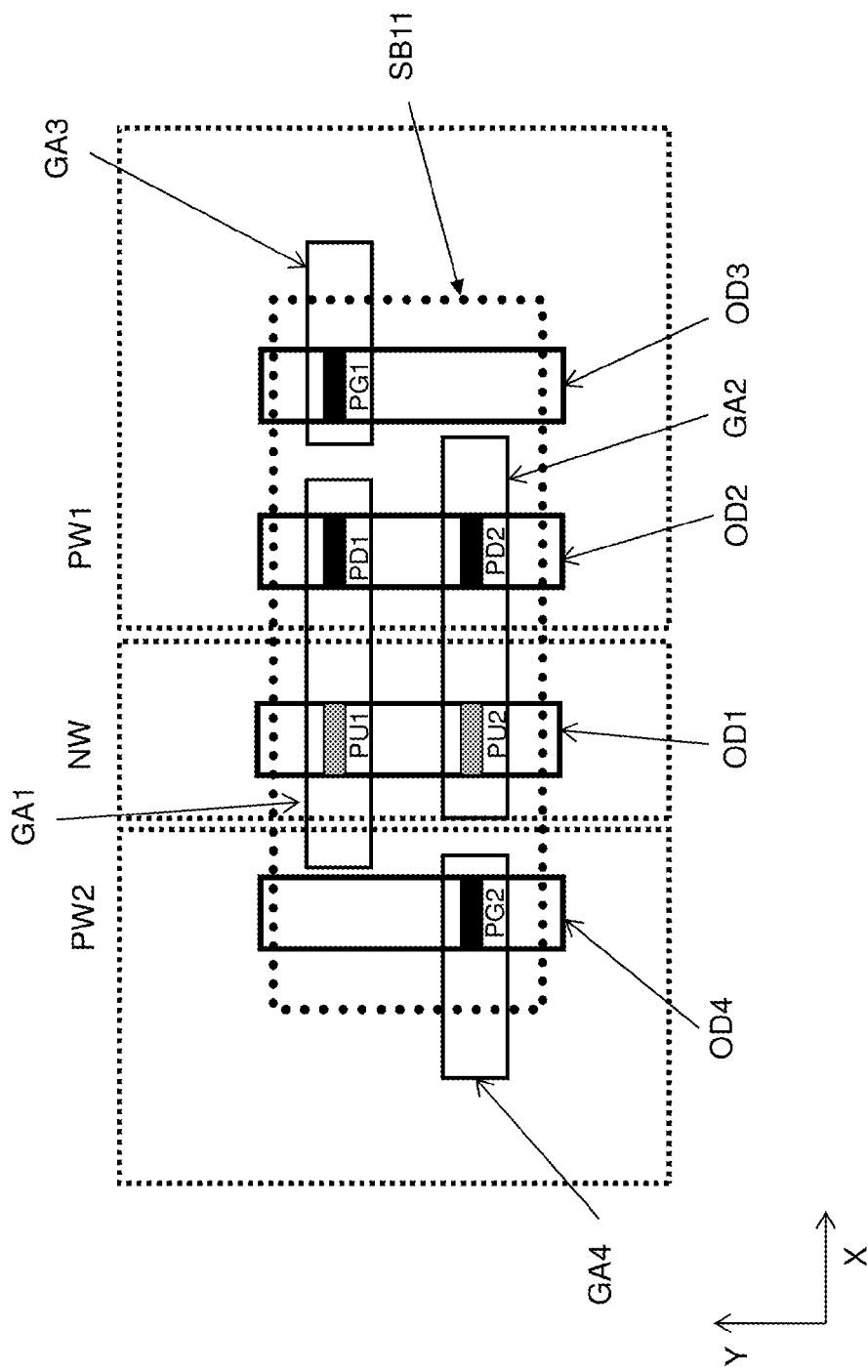
FIGS. 10A through 10D are layouts of an SRAM cell according to an embodiment of the present disclosure.

On the other hand, the source active regions OD7 and OD8 (see FIGS. 8 and 9) of the second strap region STR2, which are connected to the third and fourth source active regions OD3 (see FIGS. 9 and 10A) and OD4 (see FIGS. 9 and 10A) of the SRAM cells in the first column CL1, have a shorter length in Y (column) direction than the third and fourth source active regions OD3 (see FIGS. 9 and 10A) and OD4 (see FIGS. 9 and 10A). Thus, only one of the third source active regions OD3 (see FIGS. 9 and 10A) of the first subarray or the second subarray is connected to the source active region OD7 (see FIGS. 8 and 9) in the strap region. The source active region OD7 (see FIGS. 8 and 9) is connected only to the third source active region OD3 of the SRAM cells in the second subarray SB. Similarly, the source active region OD8 (see FIGS. 8 and 9) is connected only to the fourth source active region OD4 (see FIGS. 9 and 10A) of the SRAM cells in the second subarray SB. Accordingly, the first bitline BL1 (see FIGS. 7A and 9) in the first subarray SA1 and the second bitline BL2 (see FIGS. 7A and 9) in the second subarray SA2 are physically separated in the second strap region STR2. Similarly, the first complementary bitline BLB1 (FIGS. 7A and 9) in the first subarray SA and the second complementary bitline BLB2 (see FIGS. 7A and 9) in the second subarray SB are physically separated in the second strap region STR2. On the other hand, the third bitline BL3 (see FIGS. 7A and 8), the third complementary bitline BLB3 (see FIGS. 7A and 8), and the upper first and second power supply lines VDD2 and VSS2 (see FIGS. 7A and 8) extend over the second strap region STR2.

Referring to FIG. 9, boundaries of a single continuous source active region are defined by an STI. Thus, any adjacent source active regions, either in Y (column) direction or X (row) direction, are separated by an STI interposed therebetween. The source active regions OD5 through OD8 are extensions of the first through fourth source active regions OD1 through OD4 of the SRAM cells of the second subarray SB, respectively, and therefore have the same property and material as the first through fourth source active regions OD1 through OD4 of the SRAM cells of the second subarray SB, respectively.

As set forth above, the third source active region OD3 of one SRAM cell is connected to the third source active region OD3 of the adjacent SRAM cell of the same subarray in the column direction, thereby forming a lower bitline. All of the third source active regions OD3 in the first subarray SA are connected, thereby forming the first bitline BL1. Similarly, the fourth source active region OD4 of one SRAM cell is connected to the fourth source active region OD4 of the adjacent SRAM of the same subarray in the column direction, thereby forming a lower complementary bitline. All of the fourth source active regions OD4 in the first subarray SA1 are connected, thereby forming the first complementary bitline BLB1.

The second bitline BL2 is physically separated from the first bitline BL1 at the second strap region STR2, and the second complementary bitline BLB2 is also physically separated from the first complementary bitline BLB1 at the second strap region STR2. The third bitline BL3 and the third complementary bitline BLB3 extend over the first subarray SA, the second subarray SB, and the first through third strap regions STR1, STR2, and STR3.

The connection members CN may be formed by a contact bar disposed on the source active region and a via in the first via level disposed on the contact bar. The second bitline BL2 and second complementary bitline BLB2 are connected to the third bitline BL3 and the third complementary bitline BLB3 at the second and third strap regions STR2 and STR3 by the connection members CN.

The third bitline BL3 and the third complementary bitline BLB3 are formed by a metal layer located in the first metal layer level in the present embodiment. Such features will be more apparent with reference to FIGS. 10C and 10D. However, the present disclosure is not limited thereto. According to other embodiments, the third bitline BL3 and the third complementary bitline BLB3 may be formed by an upper metal layer (e.g., second or third metal layer level) located above the first metal layer level. As an example, the third bitline BL3 and the third complementary bitline BLB3 are formed by the second metal layer above the first metal layer as illustrated in FIGS. 13A and 13B which will be described later.

Referring back to FIG. 6, the first column CL1 of the SRAM array may further include a fourth bitline BL4 and a fourth complementary bitline BLB4. The fourth bitline BL4 and the fourth complementary bitline BLB4 are formed by a metal layer located above the third and fourth source active regions of the SRAM cells. In the present embodiment, the fourth bitline BL4 and the fourth complementary bitline BLB4 are formed in the same metal layer as the third bitline BL3 and third complementary bitline BLB3. The fourth bitline BL4 and the fourth complementary bitline BLB4 extend over the first strap region STR1 and are connected to the first bitline BL1 and the first complementary bitline BLB1 at the first strap region STR1 by connection member CN. In the present embodiment, the fourth bitline BL4 and the fourth complementary bitline BLB4 do not extend over the first and second subarrays. The connections of the fourth bitline BL4 and the fourth complementary bitline BLB4 to the respective source active regions of the unit cell of the first strap cell STR1 may refer to the connection of the third bitline BL3 and the third complementary bitline BLB3 to the respective source active regions of the second strap region STR2. In addition, similar to the connection members formed in the second strap region STR2 as shown in FIG. 8, the lower first and second power supply line VDD1 and VSS1 are connected to the upper first and second power supply line VDD2 and VSS2, respectively, by connection members CN formed in the first strap region STR1. To avoid redundancy, an overlap description will be omitted here.

According to one embodiment, in the second subarray SB, there is no physical connection forming an electrical path between the second bitline BL2 and the third bitline BL3 and no physical connection forming an electrical path between the second complementary bitline BLB2 and the third complementary bitline BLB3. In other words, the second bitline BL2 and the third bitline BL3 are connected only in the second and third strap regions STR2 and STR3, and the second complementary bitline BLB2 and the third complementary bitline BLB3 are connected only in the second and third strap regions STR2 and STR3.

Further, in the first subarray SA and the first and second strap region STR1 and STR2, there is no physical connection forming an electrical path between the first bitline BL1 and the third bitline BL3 and physical connection forming an electrical path between the first complementary bitline BLB1 and the third complementary bitline BLB3.

Although not illustrated in FIGS. 7A and 8, the connection members CN formed in the third strap region STR3 to connect the second bitline BL2 to the third bitline BL3, to connect the second complementary bitline BLB2 to the third complementary bitline BLB3, to connect the lower first power supply line VDD1 to the upper first power supply line VDD2, and to connect the lower second power supply line VSS1 to the upper second power supply line VSS2, may be formed in a similar manner as the connection members CN formed in the second strap region STRA2. Therefore, an overlap description will be omitted in order to avoid redundancy.

In the present embodiment, the bitline and the complementary bitline in the first subarray closer to the sense amplifier than the second subarray are formed by connected source active regions (continuous source active regions) and the bitline and the complementary bitline in the second subarray are formed by connected source active regions and by a metal layer disposed in the first metal layer level. With this structure, it is possible to lower the overall resistance of the bitline in the second subarray and to lower a bitline coupling capacitance, thereby increasing an operation speed of the SRAM array. Further, it is possible to improve an operation margin in a sense amplifier by reducing a differential speed due to at least doubled Ion/Ioff ratio. Moreover, by using VGAA transistors, an area of the SRAM array can be reduced.

Now referring to FIGS. 10A through 10D which illustrate layouts of the SRAM cell SB11 as an example, the second source active region OD2, by which source regions of the first and second pull-down transistors PD1 and PD2 are formed, and the third source active region OD3, by which a source region of the first pass-gate transistor PG1 is formed, are formed in a first P-type well PW1. The fourth source active region OD4, by which a source region of the second pass-gate transistor PG2 is formed, is formed in a second P-type well PW2. The first source active region OD1, by which source regions of the first and second pull-up transistors PU1 and PU2 are formed, is formed in an N-type well NW interposed between the first and second P-type wells PW1 and PW2. Although not shown in the drawings, the first and second P-type wells and the N-type well continuously extend in Y (column) direction to the entire region of the strap regions arranged in the same column as the SRAM cell SB11. The circuit diagram of the SRAM cell SB11 corresponds to the circuit diagrams illustrated in FIGS. 1A and 1B. A description of the circuit diagraph of the SRAM cell SB11 will be omitted here to avoid redundancy.

In FIG. 10A, the widths (along X direction) of the source active regions are equal to each other. However, the widths of the source active regions may not necessarily be the same. The widths of the first and second source active regions OD1, OD2 may be smaller than the width of the third and fourth source active regions OD3, OD4 in some embodiments, and the widths of the first and second source active regions OD1, OD2 may be greater than the width of the third and fourth source active regions OD3, OD4 in other embodiments. Yet in other embodiments, the widths of the first to fourth source active regions OD1 through OD4 may be different.

Still referring to FIG. 10A, the SRAM includes four gate electrode layers. A first gate electrode layer GA1 connects gate electrodes of the first pull-up transistor PU1 and the second pull-down transistor PD1. A second gate electrode layer GA2 connects gate electrodes of the second pull-up transistor PU2 and the second pull-down transistor PD2. A third gate electrode layer GA3 is coupled to a gate electrode of the first pass-gate transistor PG1 and is connected to the wordline WL shown in FIG. 10D. A fourth gate electrode layer GA4 is coupled to a gate electrode of the second pass-gate transistor PG2 and is also connected to the wordline WL. As shown in FIG. 10A, the first through fourth gate electrode layers GA1 through GA4 extend in the X direction.

Figure 10B:
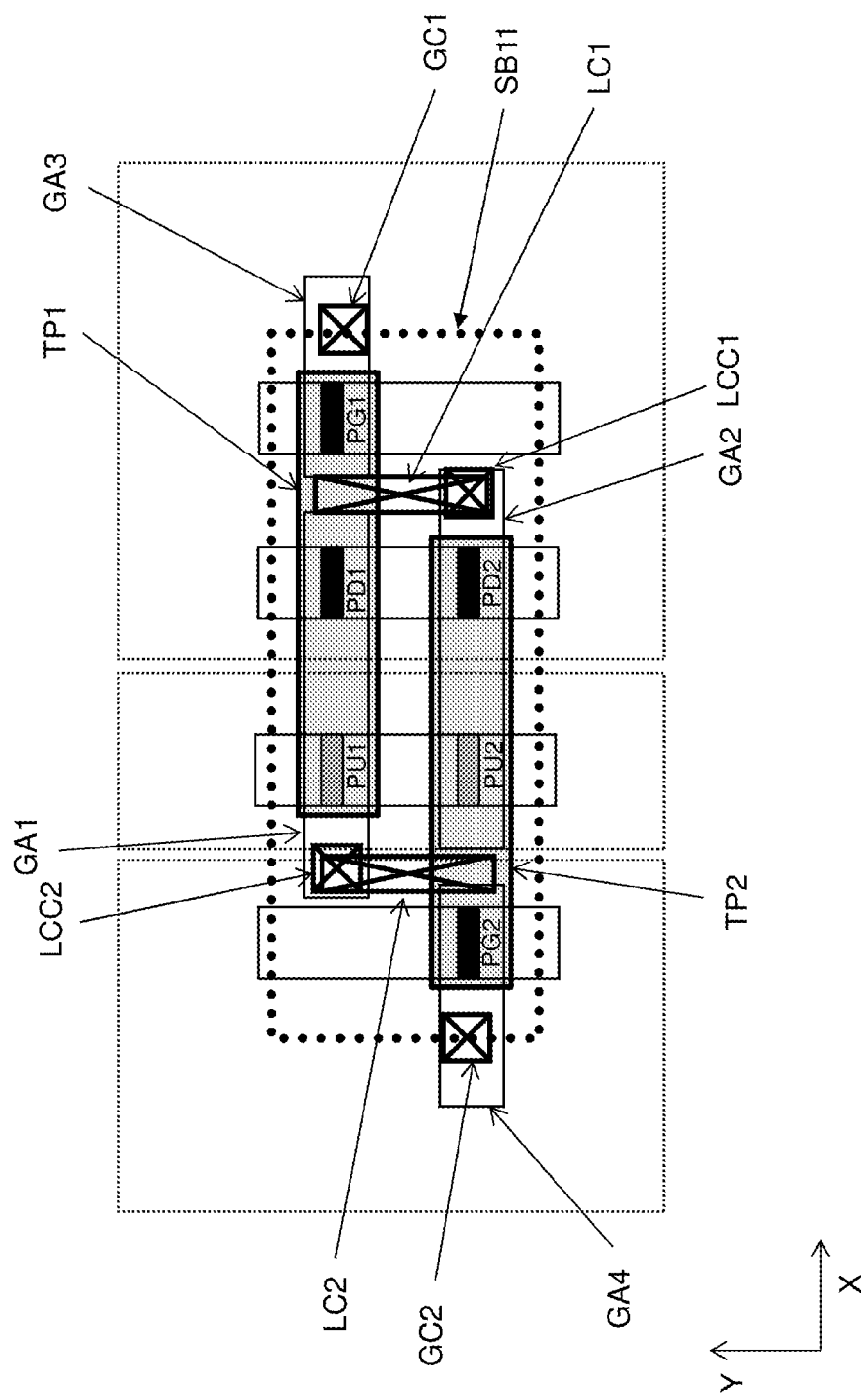

As shown in FIG. 10B, an exemplary layout structure and configuration of some of the layers/elements in the SRAM cell SB11 above the source active regions and the gate electrode layers, the SRAM cell SB11 further includes a first top plate layer TP1 coupled to drain regions of the first pull-up transistor PU1, the first pull-down transistor PD1, and the first pass-gate transistor PG1, and a second top plate layer TP2 coupled to drain regions of the second pull-up transistor PU2, the second pull-down transistor PD2, and the second pass-gate transistor PG2. Each of the first top plate layer TP1 and the second top plate layer TP2 may have a rectangular shape in a plane parallel to a major surface of the substrate on which the SRAM cell SB11 is formed. Each of the first and second top plate layers TP1 and TP2 is formed of a heavily doped semiconductor layer and may further include one or more layers of Si, Ti-base silicide, Co-base silicide, Ni-base silicide, Pt-base silicide, TiN, TaN, W, Cu or Al, or any other suitable materials formed over the heavily doped semiconductor layer.

The SRAM cell SB11 further includes a first local connection structure electrically connecting the second gate electrode layer GA2 and the first top plate layer TP1, and a second local connection structure electrically connecting the first gate electrode layer GA1 and the second top plate layer TP2. The first local connection structure includes a first local connection contact LCC1 disposed on the second gate layer GA2 and a first local connection layer LC1 connecting the first local connection contact LCC1 and the first top plate layer TP1. The second local connection structure includes a second local connection contact LCC2 disposed on the first gate electrode layer GA1 and a second local connection layer LC2 connecting the second local connection contact LCC2 and the second top plate layer TP2. The vertical configuration of the first and second local connection structures with reference to the respective gate electrode layers and the top plate layers may refer to the aforementioned local connection structure including the gate contact 145 and the local connection layer 150 as illustrated in FIG. 2. The structures of the first and second local connection structure may not be limited to the combination of LCC1 and LC1 or LCC2 and LC2. The structures of the first and second local connection structure may include a contact to the top plate layer or one or more conductive elements disposed in the layer(s) above the top plate.

FIG. 10B also illustrates a first gate contact GC1 disposed on the third gate electrode layer GA3 and a second gate contact GC2 disposed on the fourth gate electrode layer GA4. The gate contacts GC1 and GC2 are a part of an electrical path from the gate electrode layers GA3 and GA4 to the wordline WL (the wordline WL will be described with reference to FIG. 10D), respectively.

Figure 10C:
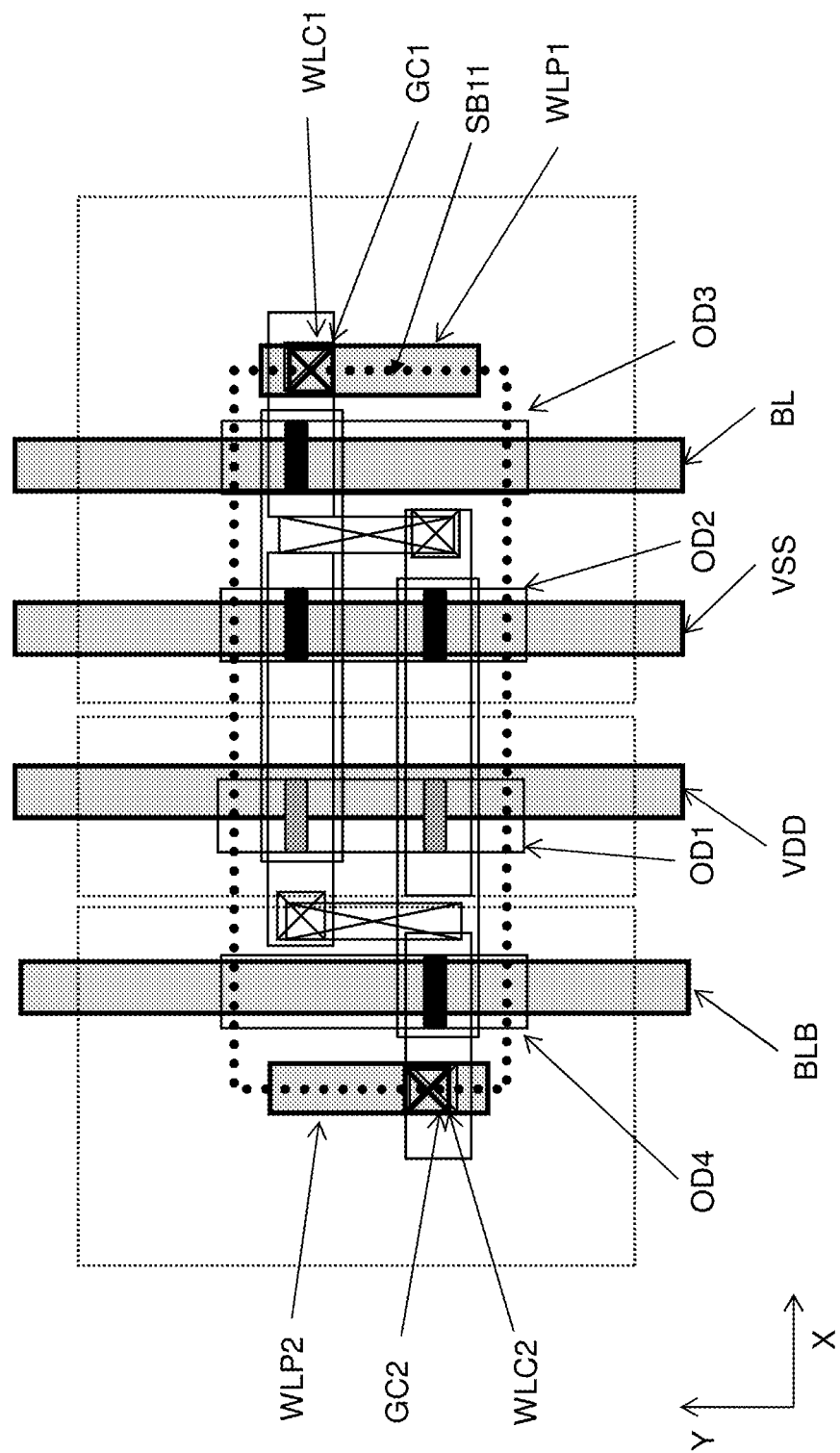

FIG. 10C shows a layout structure and configuration of the elements in the first via level and the first metal layer level. The first metal layer level includes a first power supply line VDD, a second power supply line VSS, a bitline BL and a complementary bitline BLB. Within the SRAM cell SB11, there is no physical connection forming an electrical path between the bitline BL and the third source active region OD3, and there is no physical connection forming an electrical path between the complementary bitline BLB and the fourth source active region OD4. Similarly, within the SRAM cell SB11, there is no physical connection forming an electrical path between the first power supply line VDD and the first source active region OD1, and there is no physical connection forming an electrical path between the second power supply line VSS and the second source active region OD2.

As shown in FIG. 10C, a first wordline plate WLP1 and a second wordline plate WLP2 are also disposed in the first metal layer level. The first wordline plate WLP1 is disposed on and connected to the first gate contact GC1 through a contact WLC1, and the second wordline plate WLP2 is disposed on and connected to the second gate contact GC2 through a contact WLC2.

Figure 10D:
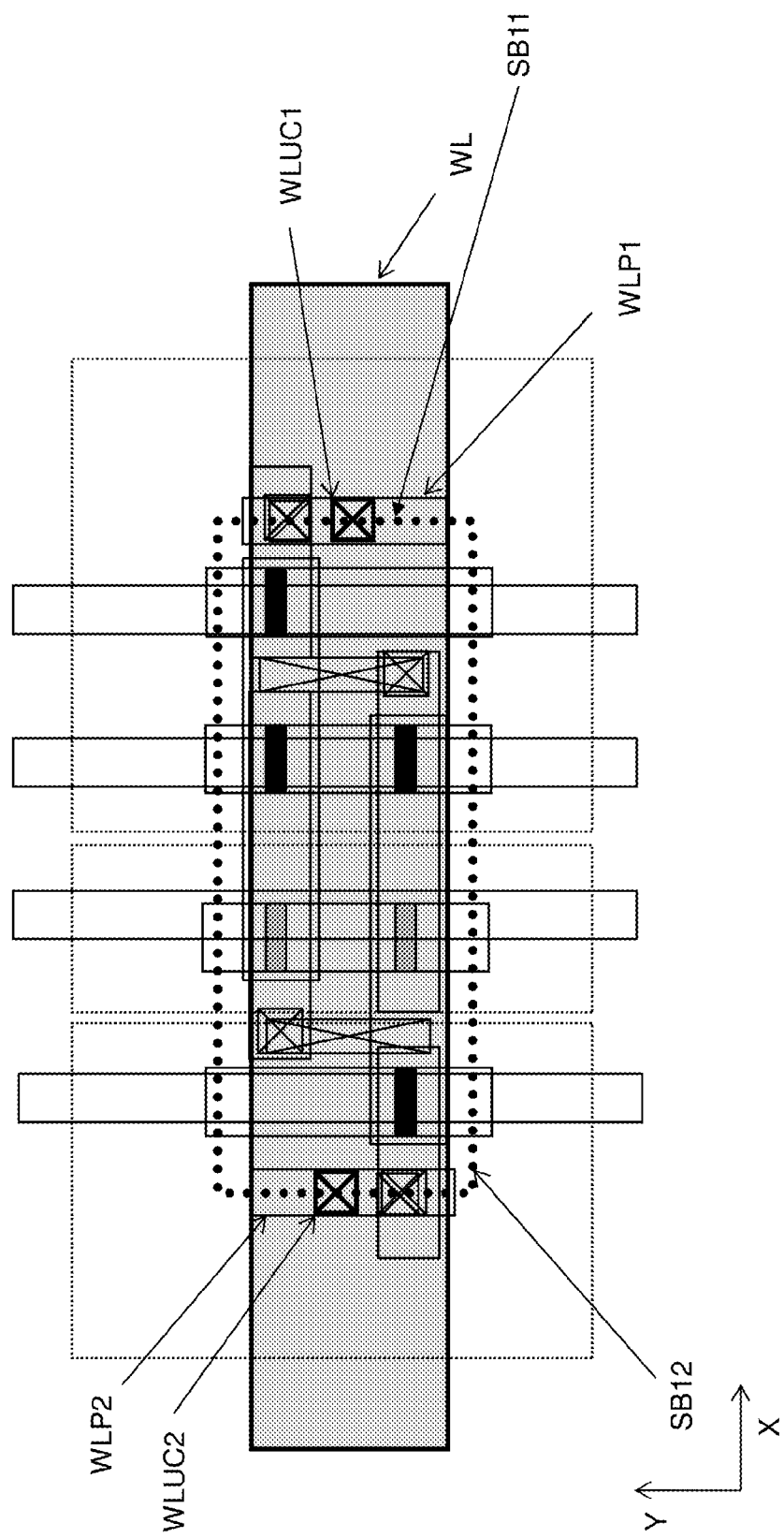

FIG. 10D shows a layout structure and configuration of the elements in the second via level and the second metal layer level. Referring back to FIGS. 3 and 4, the second via level is a level above the first metal layer level, and the second metal layer level is a level above the second via level. As shown in FIG. 10D, in the second metal layer level, the wordline WL is disposed. The wordline WL is connected to the wordline plates WLP1 and WLP2 via wordline upper contact WLUC1 and WLUC2 disposed in the second via level, respectively. Accordingly, the wordline WL, formed in the second metal layer level, is electrically connected to the gate electrodes of the first and second pass-gate transistors PG1 and PG2.

Figure 11:
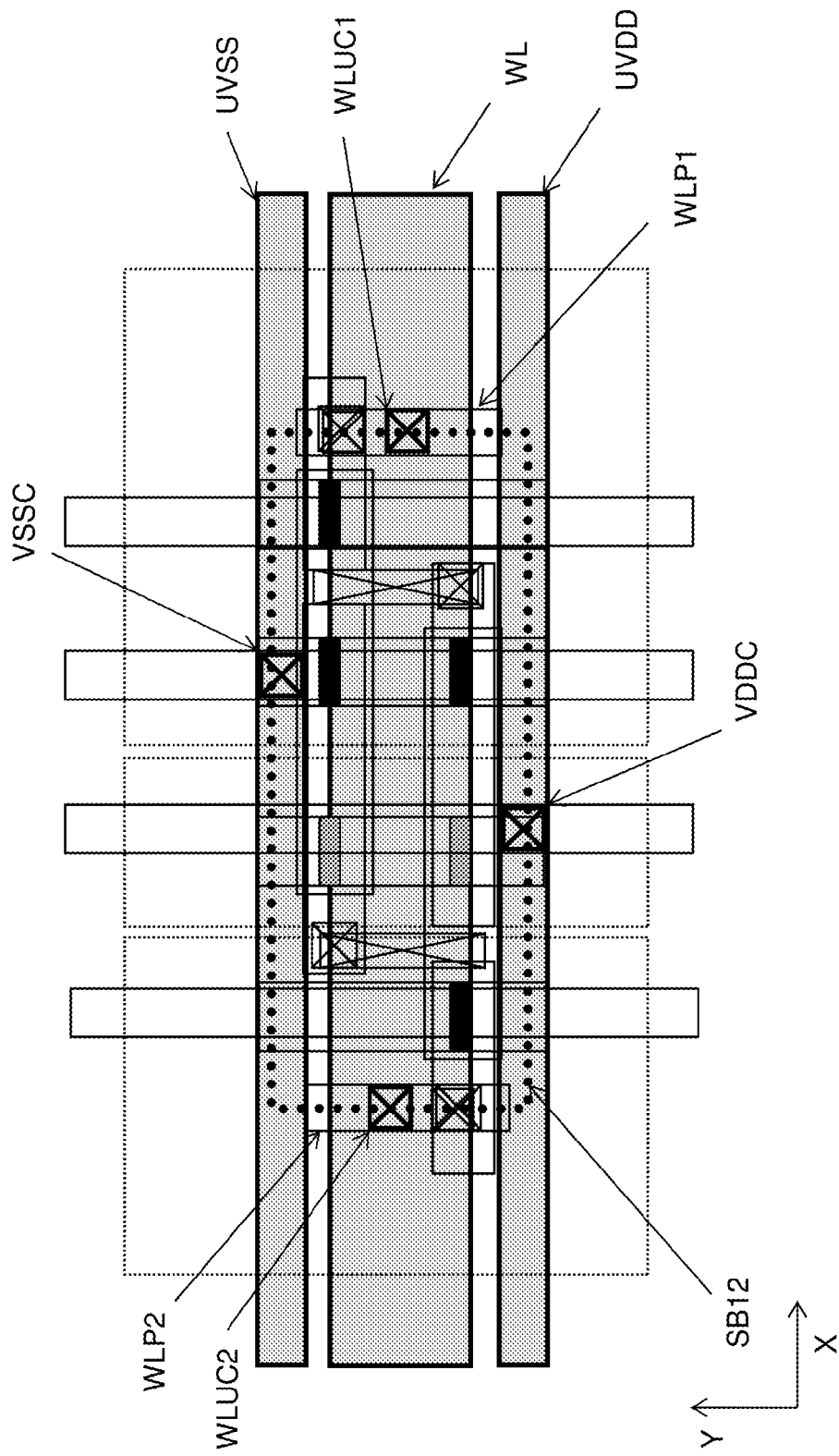
FIG. 11 illustrates a modified embodiment with respect to a second metal layer level of the embodiment shown in FIG. 10D.

FIG. 11 illustrates a modified embodiment with respect to the second metal layer level of the embodiment shown in FIG. 10D. As shown in FIG. 11, according to one embodiment, an upper first power supply line UVDD and an upper second power line UVSS may also be disposed in the second metal layer level. The upper first power supply line UVDD is connected to the first power supply line VDD via a contact VDDC disposed in the second via level, and the upper second power supply line UVSS is connected to the second power supply line VSS via a contact VSSC disposed in the second via level. In this case, the upper first and second power supply lines UVDD and UVSS both extend parallel to the wordline WL.

Figure 12A:
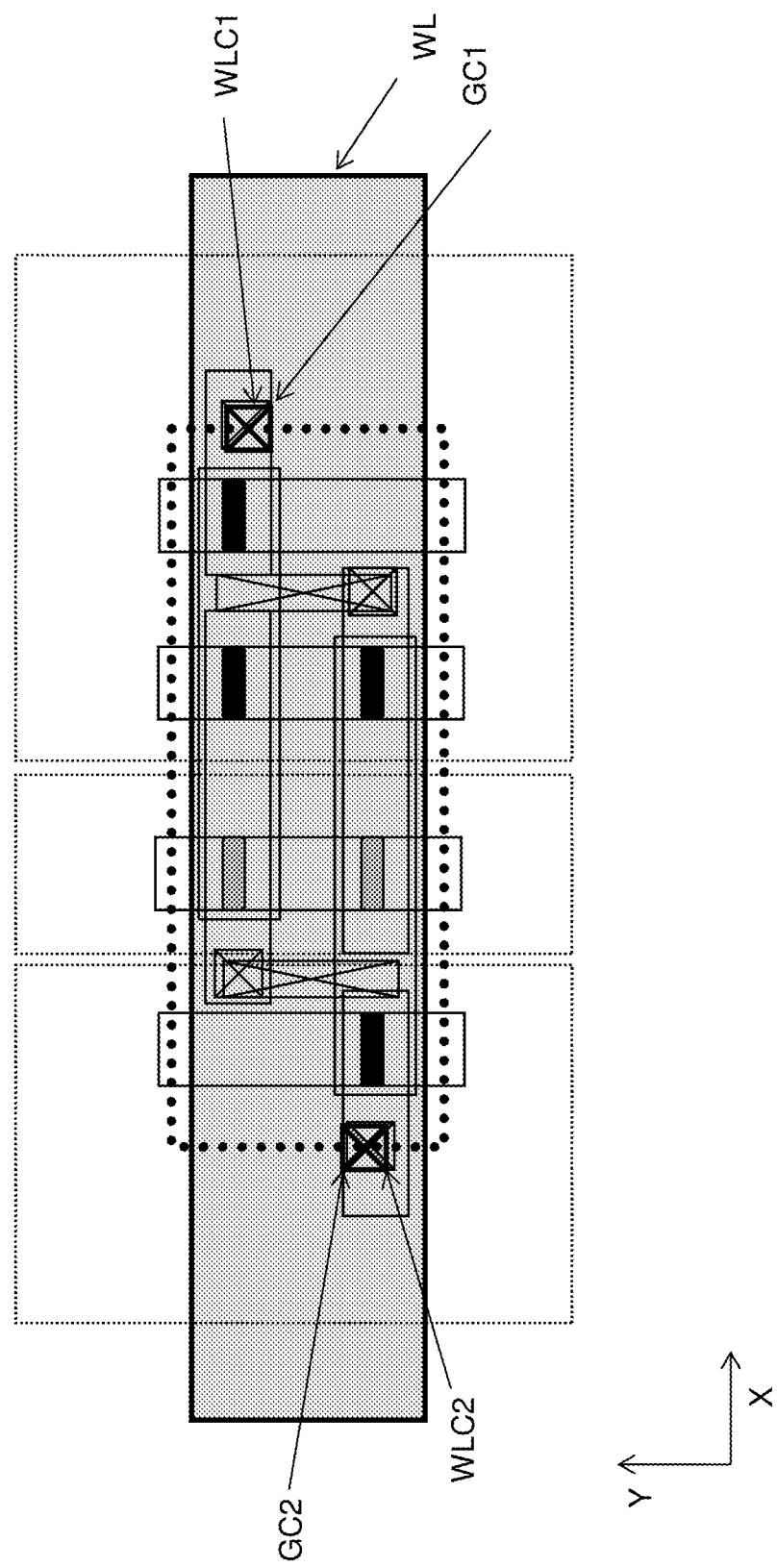
FIGS. 12A and 12B show a modified embodiment with respect to first and second metal layer levels and first and second via levels of the embodiment shown in FIGS. 10C and 10D, respectively.
Figure 12B:
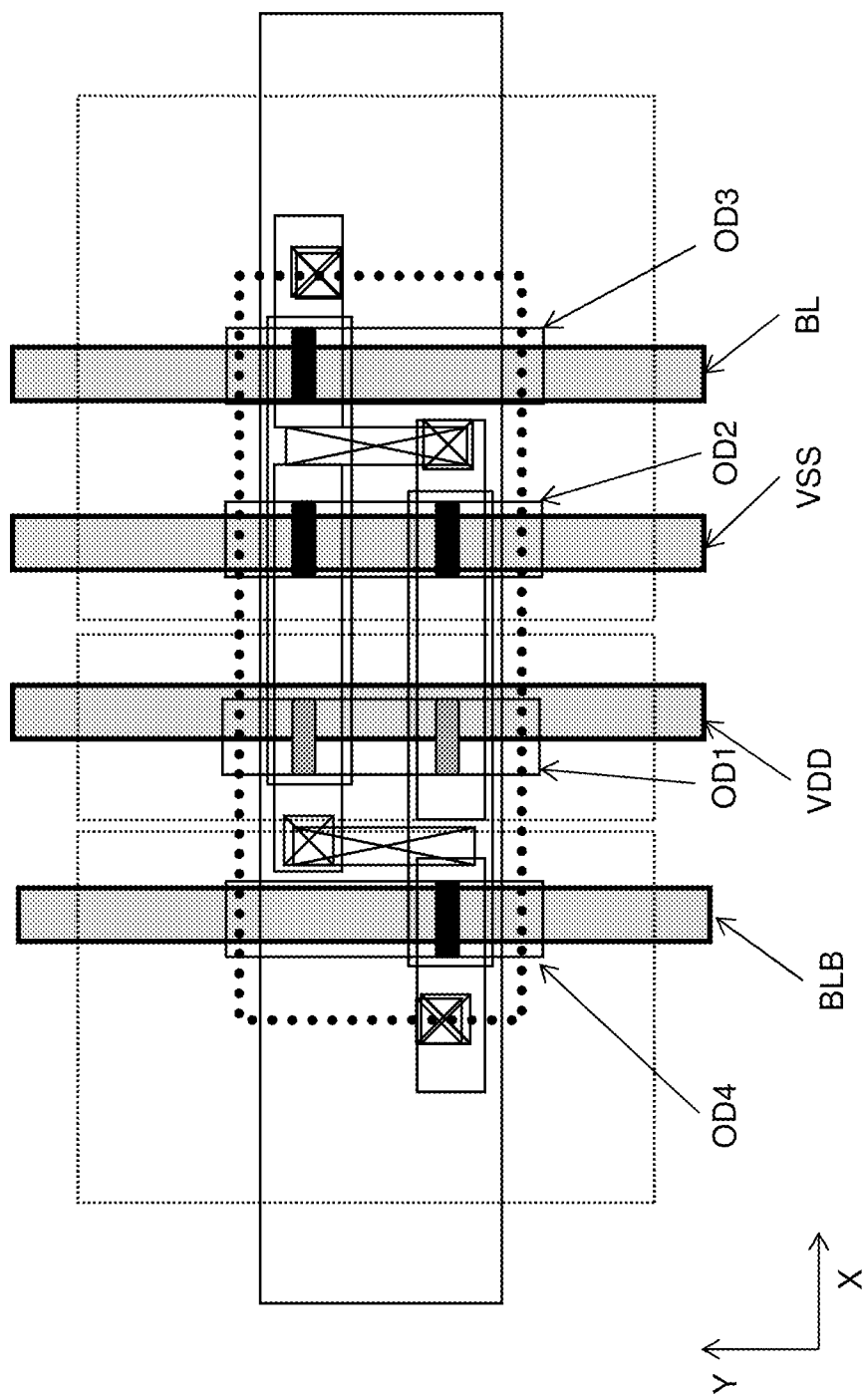

FIGS. 12A and 12B show a modified embodiment with respect to the first and second metal layer levels and the first and second via levels of the embodiment shown in FIGS. 10C and 10D, respectively. In this modified embodiment, the layers below the first metal layer level and the first via level are the same as those shown in FIGS. 10A and 10B. In FIG. 12A, the wordline WL is disposed in the first metal layer level, and connected to the first and second gate contacts GC1 and GC2 via wordline contacts WLC1 and WLC2 disposed in the first via level, respectively. As shown in FIG. 12B, the second metal layer level includes the first power supply line VDD, the second power supply line VSS, the bitline BL, and the complementary bitline BLB. There is no physical connection forming an electrical path between the bitline BL and the third source active region OD3, and there is no physical connection forming an electrical path between the complementary bitline BLB and the fourth source active region OD4. Similarly, there is no physical connection forming an electrical path between the first power supply line VDD and the first source active region OD1, and there is no physical connection forming an electrical path between the second power supply line VSS and the second source active region OD2.

FIGS. 13A and 13B are exemplary layout structures of bitlines of an SRAM array according to another embodiment of the present disclosure. Some features of the layout structures and configurations illustrated in FIGS. 13A and 13B may overlap that of the layout structures and configurations illustrated in FIGS. 5 and 6, respectively. An overlap description thereof will be omitted.

In the present embodiment, as shown in FIG. 13A, the SRAM array further includes a fourth strap region STR4 in the second subarray SB, thereby dividing the second subarray SB into first and second groups SB1 and SB2. In each column of the SRAM array, the second bitline BL2 and the second complementary bitline BLB2 are connected to the third bitline BL3 and the third complementary bitline BLB3 by connection members CN, respectively, at the fourth strap region STR4 as well as at the second and third strap regions STR2 and STR3. With this structure, it is possible to further lower the overall resistance of the bitlines in the second subarray SB.

The third bitline BL3 and the third complementary bitline BLB3 are formed by a metal layer located in the first metal layer level according to the present embodiments. However, the present disclosure is not limited thereto. According to one embodiment, the third bitline BL3 and the third complementary bitline BLB3 are formed by an upper metal layer (e.g., second or third metal layer level) located above the first metal layer level. When the third bitline BL3 and the third complementary bitline BLB3 are formed by a metal layer in the second metal layer level, the connection member CN may be formed by a contact bar disposed on the source active region, a first via in the first via level disposed on the contact bar, a first metal layer (pad metal layer) in the first metal layer level disposed on the first via and a second via in the second via level disposed on the first pad metal layer.

Figures 14A, 14B:
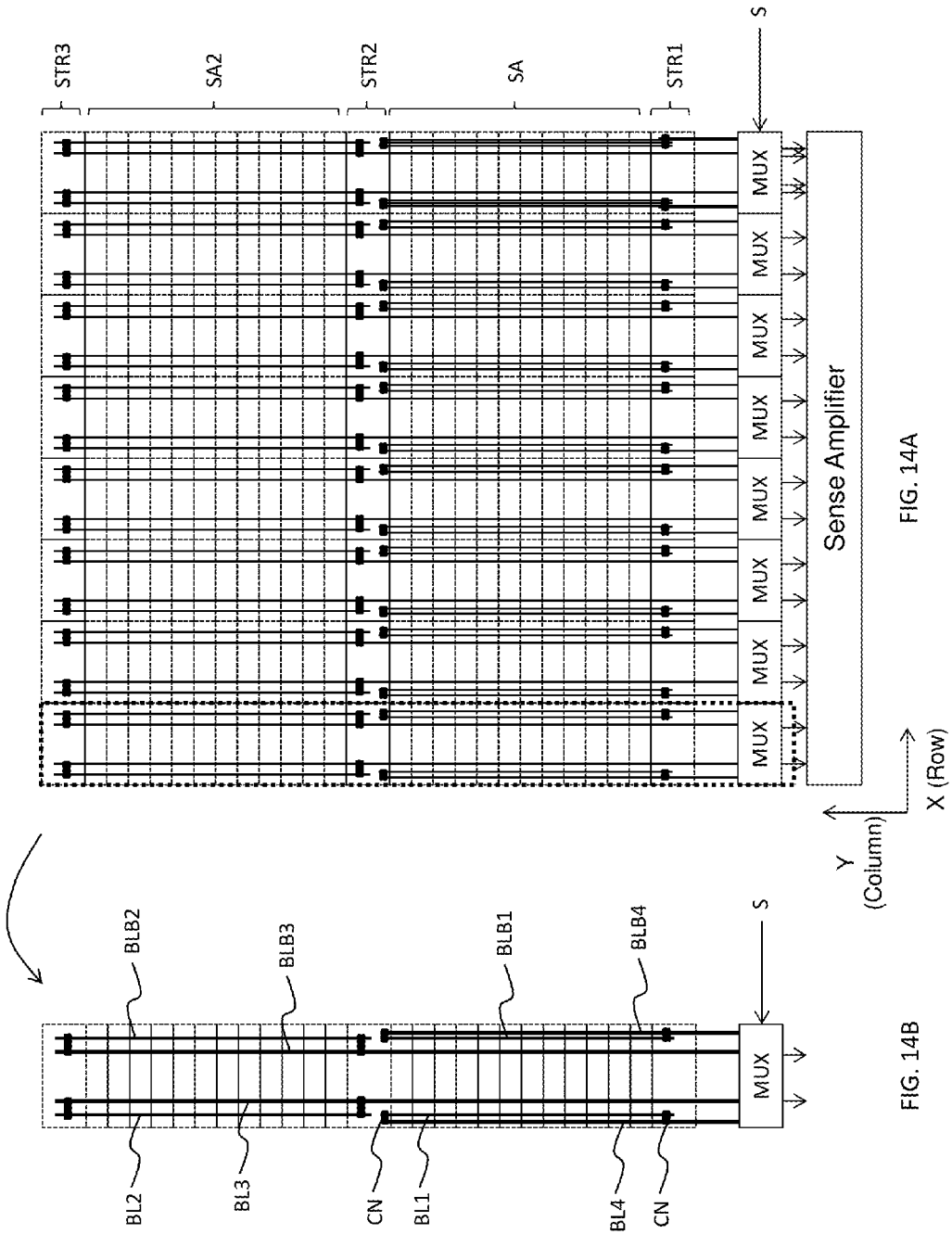

FIGS. 14A and 14B are exemplary layout structures of bitlines of an SRAM array according to one embodiment of the present disclosure. Some features of the layout structures and configurations illustrated in FIGS. 14A and 14B may overlap that of the layout structures and configurations illustrated in FIGS. 5 and 6, respectively. An overlap description thereof will be omitted.

In FIGS. 14A and 14B, unlike FIGS. 5 and 6, the fourth bitline BL4 and the fourth complementary bitline BLB4 extend over the first subarray SA as well as the first and second strap regions STR1 and STR2. As shown in FIG. 14B, the fourth bitline BL4 and the fourth complementary bitline BLB4 are connected to the first bitline BL1 and the first complementary bitline BLB1 by connection members CN, respectively, at the first and second strap regions STR1 and STR2.

The third bitline BL3 and the third complementary bitline BLB3 are formed by a metal layer located in the first metal layer level in one embodiment. However, the third bitline BL3 and the third complementary bitline BLB3 are formed by an upper metal layer (e.g., second or third metal layer level) located above the first metal layer level in other embodiments. When the third bitline BL3 and the third complementary bitline BLB3 are formed by a metal layer in the second metal layer level, the connection member CN may be formed by a contact bar disposed on the source active region, a first via in the first via level disposed on the contact bar, a first metal layer (pad metal layer) in the first metal layer level disposed on the first via and a second via in the second via level disposed on the first pad metal layer. In such a case, the fourth bitline BL4 and the fourth complementary bitline BLB4 may be formed in the first metal layer level. Alternatively, the third bitline BL3 and the third complementary bitline BLB3 are formed by the first metal layer level and the fourth bitline BL4 and the fourth complementary bitline BLB4 may be formed in an upper metal layer level located above the first metal layer level.

Although not illustrated in FIGS. 14A and 14B, according to one embodiment, a fourth strap region, similar to the fourth strap regions STR4 of FIGS. 13A and 13B, may be formed in the second subarray SB.

In the embodiment illustrated in FIGS. 14A and 14B, the bitline and the complementary bitline in the first subarray are formed by connected source active regions and a metal layer disposed in the first (or second) metal layer level, and the bitline and the complementary bitline in the second subarray are also formed by connected source active regions and by a metal layer disposed in the first (or second) metal layer level. With this structure, it is possible to further lower the overall resistance of the bitlines in the first and second subarrays, and to more flexibly design the SRAM array.

Figures 15A, 15B:
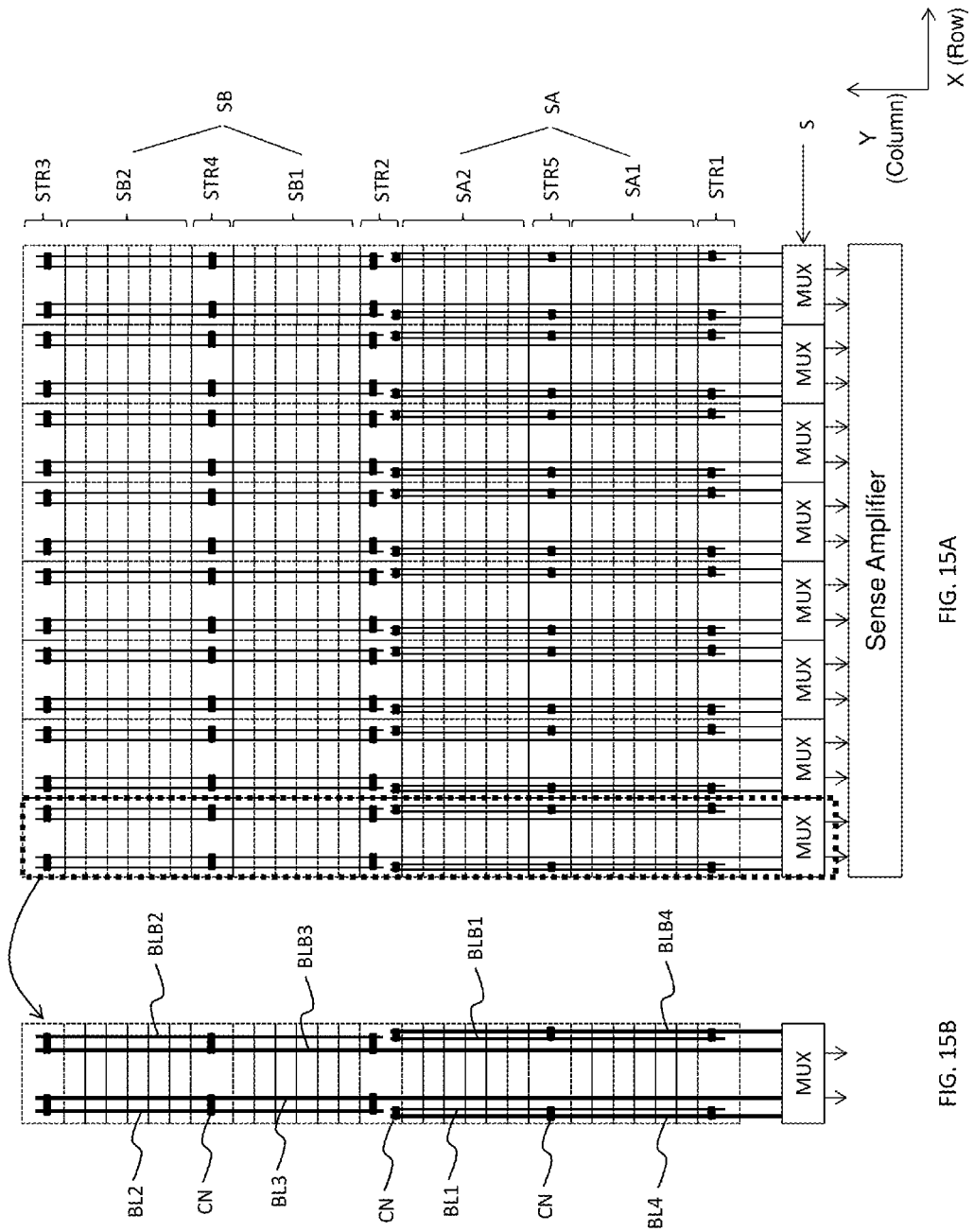

FIGS. 15A and 15B are exemplary layout structures of bitlines in an SRAM array according to one embodiment of the present disclosure. Some of the aforementioned layout structures and configurations may be applicable to the layout structure and configuration of FIGS. 15A and 15B, and detailed explanation thereof may be omitted.

Referring to FIGS. 15A and 15B, the SRAM array further includes a fourth strap region STR4 in the second subarray SB, thereby dividing the second subarray SB into first and second groups SB1 and SB2, and a fifth strap region STR5 in the first subarray SA, thereby dividing the first subarray SA into sub-arrays SA1 and SA2. In each column of the SRAM array, the second bitline BL2 and the second complementary bitline BLB2 are connected to the third bitline BL3 and the third complementary bitline BLB3 by connection members CN at the fourth strap region STR4 as well as at the second and third strap regions STR2 and STR3. Similarly, in each column of the SRAM array, the first bitline BL1 and the first complementary bitline BLB1 are connected to the fourth bitline BL4 and the fourth complementary bitline BLB4 by connection members CN, respectively, at the fifth strap region STR5 as well as at the first and second strap regions STR1 and STR2.

The third bitline BL3 and the third complementary bitline BLB3 are formed by a metal layer located in the first metal layer level in one embodiment. However, the third bitline BL3 and the third complementary bitline BLB3 are formed by an upper metal layer (e.g., second or third metal layer level) located above the first metal layer level in other embodiments. When the third bitline BL3 and the third complementary bitline BLB3 are formed by a metal layer in the second metal layer level, the connection member CN may be formed by a contact bar disposed on the source active region, a first via in the first via level disposed on the contact bar, a first metal layer (pad metal layer) in the first metal layer level disposed on the first via and a second via in the second via level disposed on the first pad metal layer. In such a case, the fourth bitline BL4 and the fourth complementary bitline BLB4 may be formed in the first metal layer level. Alternatively, the third bitline BL3 and the third complementary bitline BLB3 are formed by the first metal layer level and the fourth bitline BL4 and the fourth complementary bitline BLB4 may be formed in an upper metal layer level located above the first metal layer level.

In this embodiment, the bitline and the complementary bitline in the first subarray are formed by connected source active regions and a metal layer disposed in the first (or second) metal layer level, and the bitline and the complementary bitline in the second subarray are also formed by connected source active regions and by a metal layer disposed in the first (or second) metal layer level. With this structure, it is possible to further lower the overall resistance of the bitlines in the first and second subarrays and to more flexibly design the SRAM array.

Figures 16A, 16B:
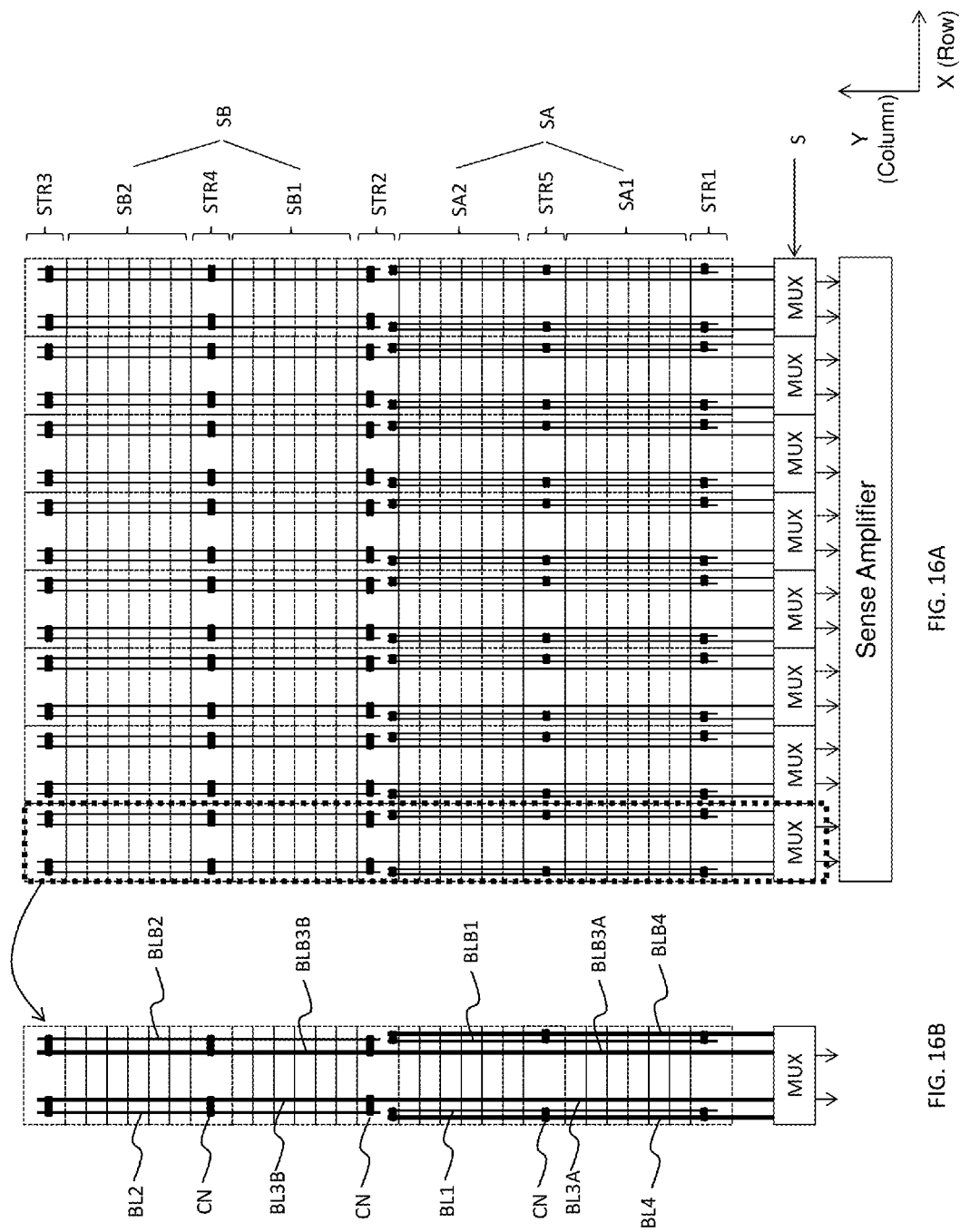

FIGS. 16A and 16B are exemplary layout structures of bitlines in an SRAM array according to one embodiment of the present disclosure. Some of the aforementioned layout structures and configurations may be applicable to the layout structure and configuration of FIGS. 16A and 16B, and detailed explanation thereof may be omitted. The layout structures and configurations shown in FIGS. 16A and 16B are similar to those in FIGS. 15A and 15B, except for the structures of the third bitline and the third complementary bitline.

As shown in FIG. 16B, the third bitline is divided into a first third-bitline BL3A extending over the first subarray SA and a second third-bitline BL3B extending over the second subarray SB. The first third-bitline BL3A is formed by a metal layer disposed in the first metal layer level, while the second third-bitline BL3B is formed by a metal layer disposed in the third metal layer level above the first and second metal layer levels. The first third-bitline BL3A, the second third-bitline BL3B and the second bitline BL2 formed by source active regions are connected at the second strap region STR2 by a connection member CN. The connection member CN may be formed by a contact bar disposed on the source active region, a first via in the first via level disposed on the contact bar, a first metal layer (a part of the second third-bitline BL3B) in the first metal layer level disposed on the first via, a second via in the second via level disposed on the first pad metal layer, a second metal layer (a pad metal layer) in the second metal layer level disposed on the second via and a third via in the third via level disposed on the second pad metal layer.

Similarly, the third complementary bitline is also divided into a first third-complementary-bitline BLB3A extending over the first subarray SA and a second third-complementary-bitline BLB3B extending over the second subarray SB. The structures of the first third-complementary-bitline BLB3A and the second third-complementary-bitline BLB3B are the same as those of the first third-bitline BL3A and the second third-bitline BL3B.

With this structure, it is possible to further lower the overall resistance of the bitlines in the first and second subarrays, and to more flexibly design the SRAM array.

Figure 19:
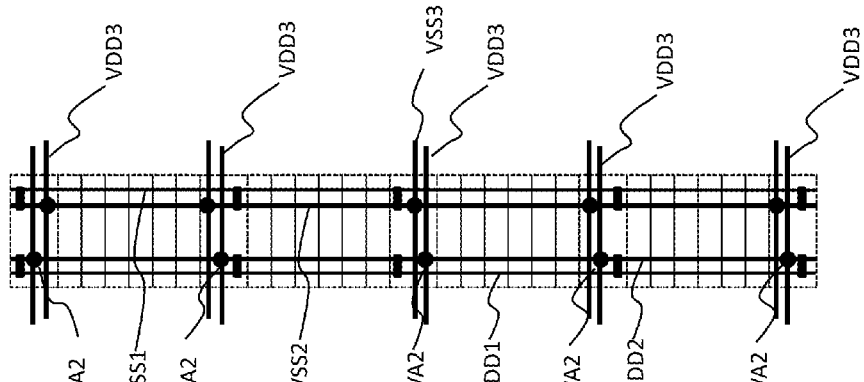
FIGS. 17 through 19 are exemplary layout structures of power supply lines in an SRAM array according to some embodiments of the present disclosure.
Figure 18:
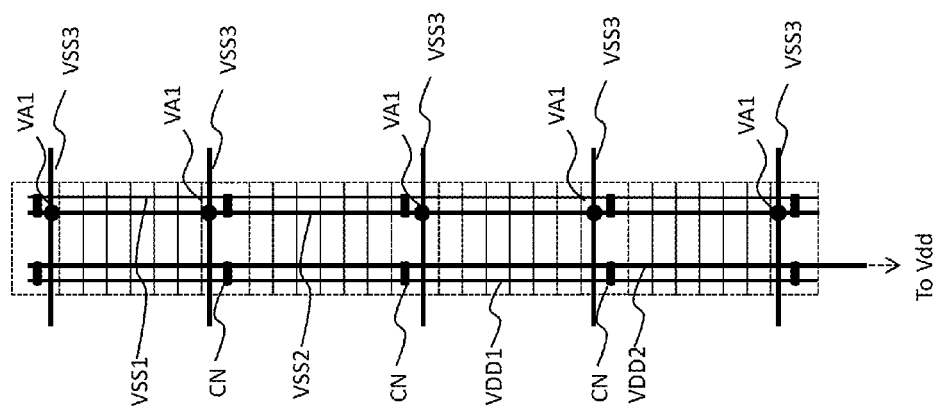
Figure 17:
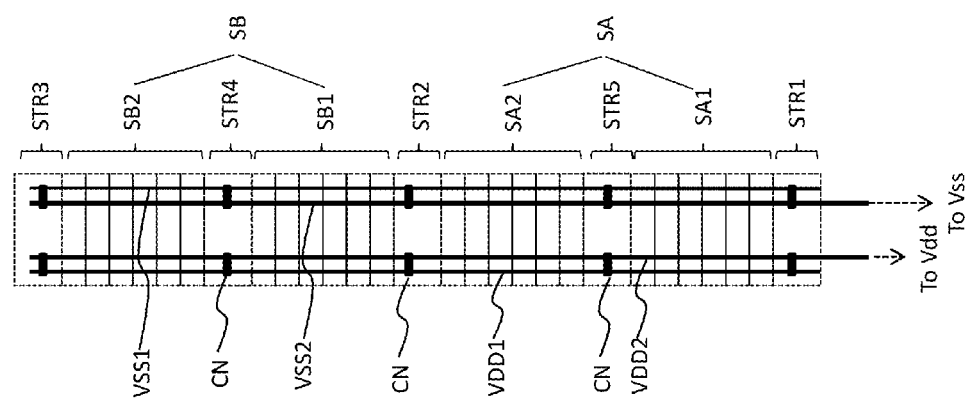

FIGS. 17 through 19 are exemplary layout structure of power supply lines in an SRAM array according to some embodiments of the present disclosure.

Each column of the SRAM array includes a lower first power supply line VDD1 and a lower second power supply line VSS1. As set forth above, the lower first power supply line VDD1 is formed by connected first source active regions OD1 (continuous source active region), and the lower second power supply line VSS1 is formed by connected second source active regions OD2 shown in FIGS. 7A and 8. Further, each column of the SRAM array includes an upper first power supply line VDD2 and an upper second power supply line VSS2.

In the embodiment illustrated in FIG. 17, the upper first power supply line VDD2 and the upper second power supply line VSS2 are formed by metal layers disposed in the first metal layer level. The upper first power supply line VDD2 and the upper second power supply line VSS2 are connected to the lower first power supply line VDD1 and the lower second power supply line VSS1 by connection members CN. The connection members CN may be formed by a contact bar disposed on the source active region and a via in the first via level disposed on the contact bar. In some embodiments, the upper first power supply line VDD2 and the upper second power supply line VSS2 are formed by metal layers disposed above the first metal layer level, for example, the third metal layer level. The upper first power supply line VDD2 and the upper second power supply line VSS2 may be coupled to a Vdd source circuit and a Vss source circuit, respectively.

In the embodiment illustrated in FIG. 18, the SRAM array further includes third power supply lines VSS3 extending in the row direction (X). The third power supply lines VSS3 are disposed at the strap regions, for example, STR1-STR5. Each of the third power supply lines VSS3 is connected to the upper second power supply lines VSS, respectively by vias VA1. The third power supply lines VSS3 are formed by metal layers disposed in the second metal layer level above the first metal layer level, and the via VA1 is disposed in the second via level. The upper second power supply lines VSS and the third power supply lines VSS3 form a mesh structure in a plan view. The third power supply lines VSS3 may be coupled to a Vss source circuit.

In the embodiment illustrated in FIG. 19, in addition to the third power supply lines VSS3 shown in FIG. 18, the SRAM array further includes fourth power supply lines VDD3 extending in the row direction (X). The fourth power supply lines VDD3 are disposed at the strap regions, for example, STR1-STR5. The fourth power supply lines VDD3 are connected to the upper first power supply lines VDD, respectively, by vias VA2. The fourth power supply lines VDD3 are formed by metal layers disposed in the second metal layer level above the first metal layer level, and the vias VA2 are disposed in the second via level. The upper first power supply lines VDD and the fourth power supply lines VDD3 form a mesh structure in a plan view. The fourth power supply lines VDD3 may be coupled to a Vdd source circuit.

Figure 20A:
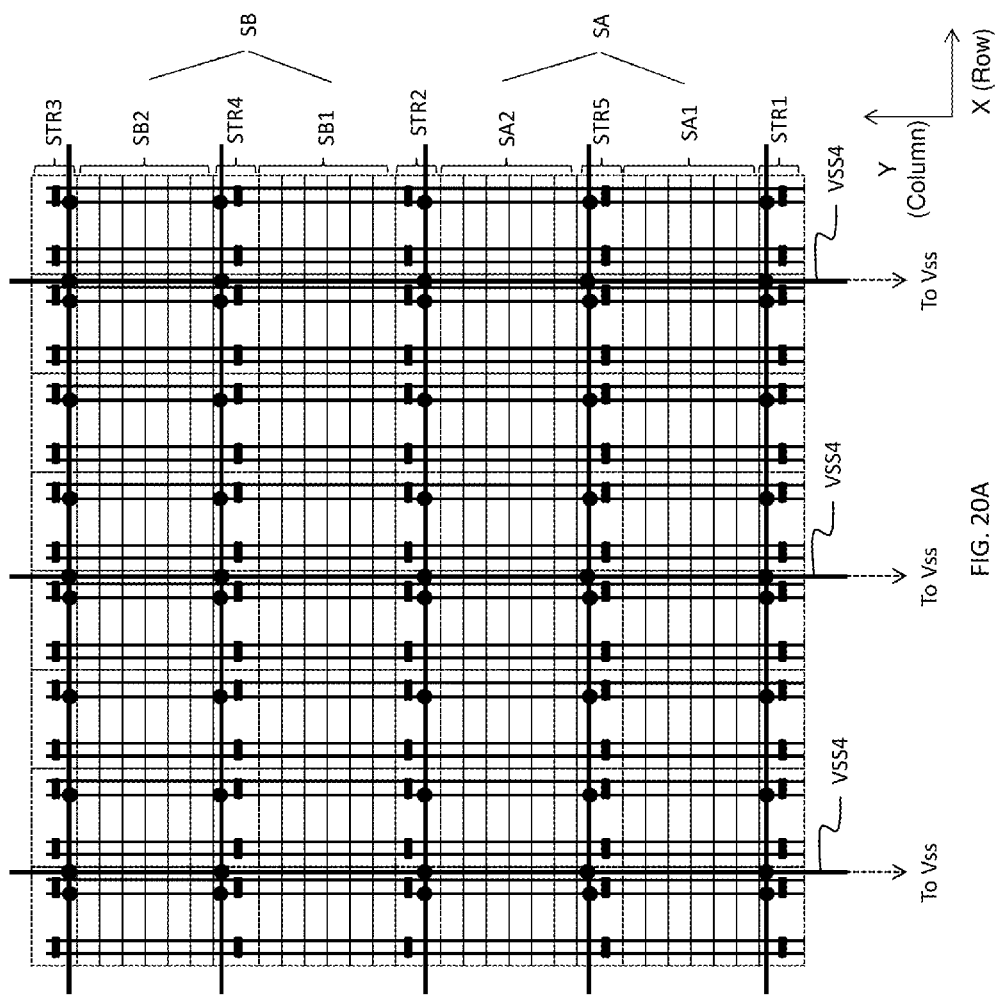
FIGS. 20A and 20B are exemplary layout structure of power supply lines in an SRAM array according to another embodiment of the present disclosure.
Figure 20B:
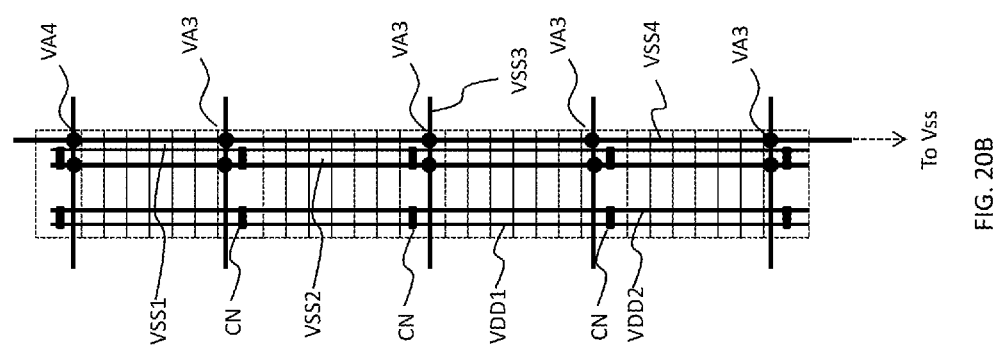

FIGS. 20A and 20B are exemplary layout structure of power supply lines in an SRAM array according to another embodiment of the present disclosure.

Referring to FIGS. 20A and 20B, the SRAM array further includes fifth power supply lines VSS4 extending in the column direction (Y). The fifth power supply line VSS4 is disposed near a boundary of the adjacent two columns. The fifth power supply lines VSS4 are not provided for all columns, but provided for, for example, every four columns. The fifth power supply lines VSS4 may be provided for every three or eight columns in some embodiments, or may be provided for all columns in other embodiments.

The fifth power supply lines VSS4 are connected to the third power supply lines VSS3, respectively, by vias VA3. The fifth power supply lines VSS4 are formed by metal layers disposed in the third metal layer level above the first and second metal layer levels, and the vias VA3 are disposed in the third via level. The fifth power supply lines VSS4 may be coupled to a Vss source circuit.

Figure 21:
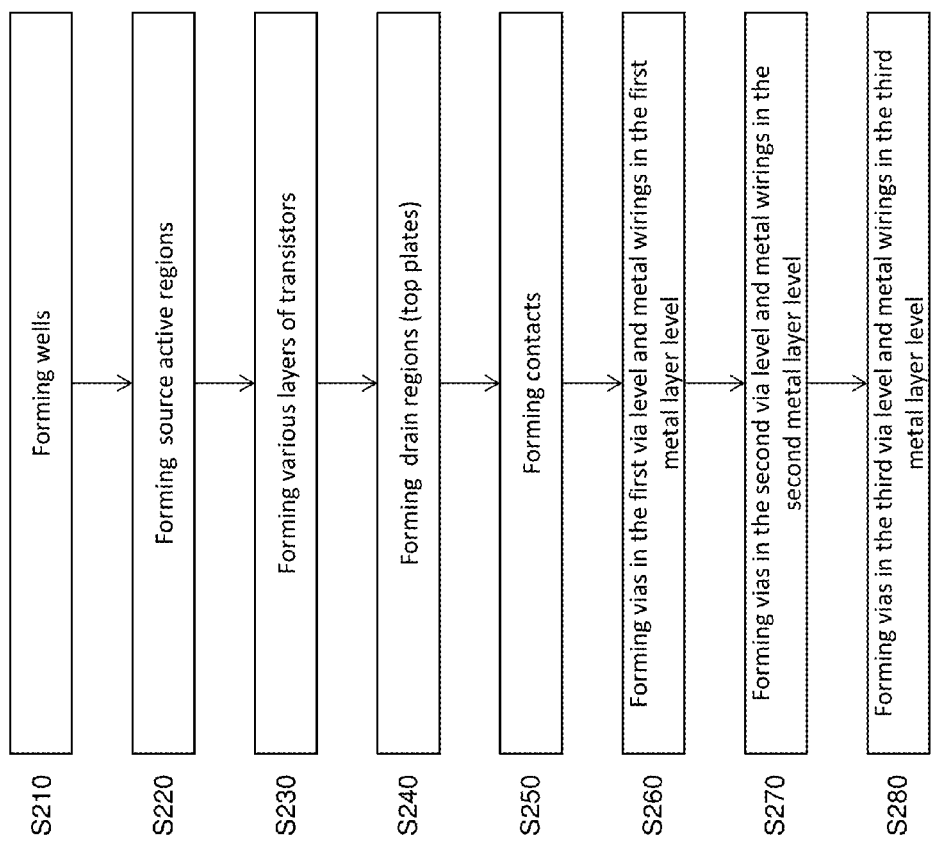
FIG. 21 shows a flowchart of a method for manufacturing an SRAM array according to an embodiment of the present disclosure.

FIG. 21 shows a flowchart of a method for manufacturing an SRAM array according to an embodiment of the present disclosure. It is understood that additional steps can be provided before, during, and after various steps illustrated by FIG. 21, and some of the operations described below can be replaced or eliminated. The order of the operations/steps may be interchangeable.

In S210, P-type wells and N-type wells having the foregoing layout, configuration and structures are formed in the substrate. In S220, source active regions, e.g., OD1 through OD8 having the foregoing layout, configuration and structures, together with corresponding silicide layers are formed in the top portions of the wells. It should be appreciated that any portions of the same continuous source active region are formed simultaneously. In 5230, various layers, such as channel layers, gate electrode layers, and gate insulating layers, of transistors, having the foregoing layout, configuration and structures, are formed over the substrate. In 5240, drain regions (top plates) having the foregoing layout, configuration and structures are formed over the various layers of the transistors. In 5250, contacts, such as contact bars, gate contacts, local connects, and plate contacts, having the foregoing layout, configuration and structures, are formed. In 5260, the first vias in the first vial level and first level metal wirings in the first metal layer level, having the foregoing layout, configuration and structures, are formed. In 5270, the second vias in the second via level and second level metal wirings in the second metal layer level, having the foregoing layout, configuration and structures, are formed. If necessary, in 5280, the third vias in the third via level and third level metal wirings in the third metal layer level, having the foregoing layout, configuration and structures, are formed.

The various embodiments or examples described herein offer several advantages over the existing art. For example, in the present disclosure, the bitline and the complementary bitline in the first subarray closer to the sense amplifier than the second subarray are formed by connected source active regions (continuous source active region) and the bitline and the complementary bitline in the second subarray are formed by connected source active regions and by a metal layer disposed in the first metal layer level. With this structure, it is possible to lower the overall resistance of the bitline in the second subarray and to lower a bitline coupling capacitance, thereby increasing an operation speed of SRAM. Further, it is possible to improve an operation margin in a sense amplifier by reducing a differential speed due to at least doubled Ion/Ioff ratio. Moreover, by using VGAA transistors, an area of the SRAM unit cell can be reduced and to more effectively control short channel effects, thereby realizing a lower power operation. It is also possible to more flexibly design the SRAM array.

It will be understood that not all advantages have been necessarily discussed herein, no particular advantage is required for all embodiments or examples, and other embodiments or examples may offer different advantages.

In accordance with one aspect of the present disclosure, a static random access memory (SRAM) array includes a first subarray including a first plurality of SRAM cells and a second subarray including a second plurality of SRAM cells. The first and second plurality of SRAM cells are arranged in one column of the SRAM array. Each of the first and second plurality of SRAM cells includes first through fourth source active regions by which source regions of transistors thereof are formed. The one column of the SRAM array includes a first bitline formed by the third source active regions of the first plurality of SRAM cells, a second bitline formed by the third source active regions of the second plurality of SRAM cells and spaced apart from the first bitline, and a third bitline formed by a metal layer extending over the third source active regions of the first and second plurality of SRAM cells and electrically connected to the second bitline but not to the first bitline.

In accordance with another aspect of the present disclosure, a static random access memory (SRAM) array includes a first subarray including a first plurality of SRAM cells and a second subarray including a second plurality of SRAM cells. The first and second plurality of SRAM cells are arranged in one column of the SRAM array. Each SRAM cell of the first and second includes first through fourth source active regions by which source regions of transistors thereof are formed. The one column of the SRAM array includes a first bitline formed by the third source active regions of the first plurality of SRAM cells, a second bitline formed by the third source active regions of the second plurality of SRAM cells and spaced apart from the first bitline, a third bitline formed by a metal layer extending over the third source active regions of the first and second plurality of SRAM cells and electrically connected to the second bitline, and a fourth bitline formed by a metal layer extending over the first plurality of SRAM cells but not over the second plurality of SRAM cells and electrically connected to the first bitline.

In accordance with another aspect of the present disclosure, A static random access memory (SRAM) array includes a first subarray and a second subarray, the first subarray and the second subarray including a plurality of SRAM cells arranged in a row direction and a column direction, and a region interposed between the first subarray and the second subarray in the column direction. The region includes a first source active region connected to a first power supply line formed by a source active region of the first subarray and connected to a first power supply line formed by a source active region of the second subarray, a second source active region connected to a second power supply line formed by a source active region of the first subarray and connected to a second power supply line formed by a source active region of the second subarray, a third source active region connected to a bitline formed by a source active region of the second subarray but not connected to a bitline formed by an source active region of the first subarray, and a fourth source active region connected to a complementary bitline formed by a source active region of the second subarray but not connected to a complementary bitline formed by a source active region of the first subarray. The bitline in the first subarray is spaced apart from the bitline in the second subarray in the region. The complementary bitline in the first subarray is spaced apart from the complementary bitline in the second subarray in the region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) array, comprising:
a first subarray including a first plurality of SRAM cells and a second subarray including a second plurality of SRAM cells,
wherein the first and second plurality of SRAM cells are arranged in one column of the SRAM array,
each of the first and second plurality of SRAM cells includes first through fourth source active regions by which source regions of transistors thereof are formed, and
the one column of the SRAM array comprises:
a first bitline formed by the third source active regions of the first plurality of SRAM cells;
a second bitline formed by the third source active regions of the second plurality of SRAM cells and spaced apart from the first bitline; and
a third bitline formed by a metal layer extending over the third source active regions of the first and second plurality of SRAM cells and electrically connected to the second bitline but not to the first bitline.

2. The SRAM array of claim 1, wherein no electrical connection between the second bitline and the third bitline is formed within any of the second plurality of SRAM cells.

3. The SRAM array of claim 1, wherein:
the SRAM array further includes first and second regions, the first subarray disposed between the first region and the second region and the second region disposed between the first and second subarrays,
the third bitline extends from the first region to the second subarray,
the second bitline is electrically connected to the third bitline at the second region, and
each of the source active regions is covered by an electrically conductive layer having an electrical conductivity greater than that of each of the source active region.

4. The SRAM array of claim 3, wherein the each column of the SRAM array further comprises:
a first complementary bitline formed by the fourth source active regions of the first plurality of SRAM cells;
a second complementary bitline formed by the fourth source active regions of the second plurality of SRAM cells and spaced apart from the first complementary bitline at the second region; and
a third complementary bitline formed by a metal layer extending over the fourth source active regions of the first and second plurality of SRAM cells and electrically connected to the second complementary bitline at the second region but not to the first complementary bitline.

5. The SRAM array of claim 4, further comprising:
a fourth bitline formed by a metal layer and electrically connected to the first bitline at the first region;
a fourth complementary bitline formed by a metal layer and electrically connected to the first complementary bitline at the first region; and
a multiplexor including first through fourth input terminals electrically connected to the fourth bitline, the fourth complementary bitline, the third bitline, and the third complementary bitline, respectively, and outputting data transmitted by the first bitline and the first complementary bitline or transmitted by the second bitline and the second complementary bitline in accordance to a selection signal applied thereto.

6. The SRAM array of claim 3, further comprising a third region,
wherein the second subarray is interposed between the second and third regions, and the second bitline is electrically connected to the third bitline at the third region.

7. The SRAM array of claim 3, further comprising a fourth region between two adjacent SRAM cells of the second plurality of SRAM cells,
wherein the second bitline is electrically connected to the third bitline at the fourth region.

8. The SRAM array of claim 3, further comprising:
a first power supply line formed by the first source active regions of the first and second plurality of SRAM cells;
a second power supply line formed by the second source active regions of the first and second plurality of SRAM cells;
a third power supply line formed by a metal layer located above the first source active regions of the first and second plurality of SRAM cells and electrically connected to the first power supply line; and
a fourth power supply line formed by a metal layer located above the second source active regions of the first and second plurality of SRAM cells and electrically connected to the second power supply line,
wherein the first and second power supply lines are respectively electrically connected to the third and fourth power supply lines at least at one of the first and second regions.

9. The SRAM array of claim 8, wherein:
the SRAM array further comprises a plurality of wordlines,
the plurality of wordlines are formed by a metal layer between the third bitline and the third source active regions of the first and second plurality of SRAM cells, and
the metal layer forming the third and fourth power supply lines is located between the first and second source active regions of the first and second plurality of SRAM cells and the metal layer forming the plurality of wordlines.

10. The SRAM array of claim 8, wherein:
the SRAM array further comprises a plurality of wordlines,
the plurality of wordlines are formed by a metal layer between the third bitline and the third source active regions of the first and second plurality of SRAM cells, and
the metal layer forming the third and fourth power supply lines is located at the same metal layer as the third bitline.

11. The SRAM array of claim 1, further comprising a plurality of wordlines formed by a metal layer,
wherein the third bitline is interposed between the plurality of wordlines and the third source active regions of the first and second plurality of SRAM cells.

12. The SRAM array of claim 1, further comprising a plurality of wordlines formed by a metal layer,
wherein the plurality of wordlines are interposed between the third bitline and the third source active regions of the first and second plurality of SRAM cells.

13. The SRAM array of claim 1, wherein each SRAM cell comprises:
first and second P-type pull-up transistors formed in the first source active region;
first and second N-type pull-down transistors formed in the second source active region; and
first and second pass-gate transistors formed in the third and fourth source active regions, respectively, and the fourth, first, second and third source active regions are sequentially arranged in a direction perpendicular to the one column.

14. The SRAM array of claim 13, wherein each SRAM cell further comprises:
a first top plate electrically connected to drain regions of the first pass-gate transistor, the first N-type pull-down transistor, and the P-type first pull-up transistor;
a second top plate electrically connected to drain regions of the second pass-gate transistor, the second N-type pull-down transistor, and the second P-type pull-up transistor;
a first local connection contact electrically connecting the first top plate and gate electrodes of the second P-type pull-up transistor and the second N-type pull-down transistor to each other; and
a second local connection contact electrically connecting the second top plate and gate electrodes of the first P-type pull-up transistor and the first N-type pull-down transistor to each other.

15. The SRAM array of claim 13, wherein each transistor is a vertical field effect transistor.

16. A static random access memory (SRAM) array, comprising:
a first subarray including a first plurality of SRAM cells and a second subarray including a second plurality of SRAM cells,
wherein the first and second plurality of SRAM cells are arranged in one column of the SRAM array,
each SRAM cell of the first and second includes first through fourth source active regions by which source regions of transistors thereof are formed, and
the one column of the SRAM array comprises:
a first bitline formed by the third source active regions of the first plurality of SRAM cells;
a second bitline formed by the third source active regions of the second plurality of SRAM cells and spaced apart from the first bitline;
a third bitline formed by a metal layer extending over the third source active regions of the first and second plurality of SRAM cells and electrically connected to the second bitline; and
a fourth bitline formed by a metal layer extending over the first plurality of SRAM cells but not over the second plurality of SRAM cells and electrically connected to the first bitline.

17. The SRAM array of claim 16, further comprising a first region, a second region and a third region,
wherein the first subarray is arranged between the first region and the second region, and the second subarray is arranged between the second region and the third region,
the second bitline is spaced apart from the first bitline at the second region,
the third bitline extends over each of the first through third regions,
the first bitline is electrically connected to the fourth bitline at the first and second regions, and
the second bitline is connected to the third bitline at the second and third regions.

18. The SRAM array of claim 16, wherein the metal layer forming the third bitline is the same as the metal layer forming the fourth bitline, or is located above the metal layer forming the fourth bitline.

19. The SRAM array of claim 16, further comprising a fourth region between two adjacent SRAM cells of the second plurality of SRAM cells and a fifth region between two adjacent SRAM cells of the first plurality of SRAM cells,
 wherein the second bitline is electrically connected to the third bitline at the second through and fourth regions, and
 the first bitline is electrically connected to the fourth bitline at the first, third, and fifth regions.

20. A static random access memory (SRAM) array, comprising:
 a first subarray and a second subarray, the first subarray and the second subarray including a plurality of SRAM cells arranged in a row direction and a column direction; and
 a region interposed between the first subarray and the second subarray in the column direction and comprising:
  a first source active region connected to a first power supply line formed by a source active region of the first subarray, and connected to a first power supply line formed by a source active region of the second subarray,
  a second source active region connected to a second power supply line formed by a source active region of the first subarray, and connected to a second power supply line formed by a source active region of the second subarray;
  a third source active region connected to a bitline formed by a source active region of the second subarray, but not connected to a bitline formed by a source active region of the first subarray; and
  a fourth source active region connected to a complementary bitline formed by a source active region of the second subarray, but not connected to a complementary bitline formed by a source active region of the first subarray,
 wherein the bitline in the first subarray is spaced apart from the bitline in the second subarray in the region,
 the complementary bitline in the first subarray is spaced apart from the complementary bitline in the second subarray in the region.

* * * * *